(12) United States Patent
Howell et al.

(10) Patent No.: US 6,982,515 B2
(45) Date of Patent: Jan. 3, 2006

(54) DUAL POSITION LINEAR DISPLACEMENT MICROMECHANISM

(75) Inventors: Larry Howell, Orem, UT (US); Scott Lyon, Provo, UT (US); Brent Weight, Springville, UT (US); Deanne Clements, Lafayette, IN (US)

(73) Assignee: Brigham Young University, Provo, UT (US)

( * ) Notice: Subject to any disclaimer, the term of this patent is extended or adjusted under 35 U.S.C. 154(b) by 120 days.

(21) Appl. No.: 10/363,243

(22) PCT Filed: Sep. 12, 2001

(86) PCT No.: PCT/US01/28614

§ 371 (c)(1),
(2), (4) Date: Mar. 5, 2003

(87) PCT Pub. No.: WO02/23606

PCT Pub. Date: Mar. 21, 2002

(65) Prior Publication Data

US 2005/0073380 A1    Apr. 7, 2005

(51) Int. Cl.
*H02N 10/00* (2006.01)

(52) U.S. Cl. ...................................... 310/307

(58) Field of Classification Search ......... 310/40 MM, 310/306–309; 200/181, 600, 343, 339; 60/516, 60/527
See application file for complete search history.

(56) References Cited

U.S. PATENT DOCUMENTS

| | | | |
|---|---|---|---|
| 5,179,499 A | | 1/1993 | MacDonald et al. |
| 5,355,562 A | | 10/1994 | Matoba et al. |
| 5,649,454 A | | 7/1997 | Midha et al. |
| 5,806,152 A | | 9/1998 | Saitou et al. |
| 5,867,302 A | | 2/1999 | Fleming |
| 5,998,906 A | * | 12/1999 | Jerman et al. ............. 310/309 |
| 6,082,208 A | * | 7/2000 | Rodgers et al. ............. 74/406 |
| 6,175,170 B1 | * | 1/2001 | Kota et al. ............ 310/40 MM |
| 6,215,081 B1 | * | 4/2001 | Jensen et al. ............. 200/341 |
| 6,303,885 B1 | * | 10/2001 | Hichwa et al. ............. 200/181 |
| 6,507,138 B1 | * | 1/2003 | Rodgers et al. ............. 310/309 |
| 6,675,578 B1 | * | 1/2004 | Sinclair .................... 60/528 |
| 2004/0227428 A1 | * | 11/2004 | Sinclair .................... 310/309 |

* cited by examiner

*Primary Examiner*—Tuyen T Nguyen
(74) *Attorney, Agent, or Firm*—Madson & Metcalf

(57) ABSTRACT

An apparatus (1) that is capable of a first stable configuration and a second stable configuration is disclosed. The bistable mechanism (10) has a leg (30, 32) that is coupled on one end by a base member (22, 24) and on the other end by a shuttle (20). The leg (30, 32) stores potential energy as it is deflected. The potential energy stored in the leg (30, 32) has a maximum potential energy position with a low potential energy position on either side of the maximum. An apparatus and method are also disclosed for a latching mechanism (910) and the associated method. The latching mechanism (910) is comprised of a grasping member (932), a lock slider (928), and a detent slider (916). These three members (916, 928, 932) operate together to induce a locked configuration and an unlocked configuration by actuating the lock slider (928) in a single direction.

33 Claims, 18 Drawing Sheets

DUAL POSITION LINEAR DISPLACEMENT MICROMECHANISM

FIELD OF THE INVENTION

The present method and apparatus relates to dual position mechanisms. More particularly, the invention relates to compliant bistable mechanisms, and the invention also relates to an apparatus and method for a dual position latching mechanism.

TECHNICAL BACKGROUND

The term "compliant mechanisms" relates to a family of devices in which integrally formed flexural members provide motion through deflection. Such flexural members may therefore be used to replace conventional multi-part elements such as pin joints. Compliant mechanisms provide several benefits, including backlash-free, wear-free, and friction-free operation. Moreover, compliant mechanisms significantly reduce manufacturing time and cost. Compliant mechanisms can replace many conventional devices to improve functional characteristics and decrease manufacturing costs. Assembly may, in some cases, be obviated entirely because compliant structures often consist of a single piece of material.

In microelectromechanical systems (MEMS), compliant technology allows each mechanism of a MEMS system to be an integrally formed, single piece mechanism. Because MEMS devices are typically made by a layering and etching process, elements in different layers must normally be etched and formed separately from each other. Additionally, elements with complex shapes, such as pin joints, require multiple steps and layers to create the pin, the head, the pin-mounting joint, and the gap between the pin and the surrounding ring used to form the joint. While pin joints do have difficulties in manufacturing, these complex shapes do have advantages of allowing large displacements and low stresses compared to fully compliant mechanisms.

An integrally formed compliant mechanism, on the other hand, may be constructed as a single piece, and may even be constructed in unitary fashion with other elements of the micromechanism. Substantially all elements of many compliant devices may be made from a single layer. Reducing the number of layers, in many cases, simplifies the manufacturing and design of MEMS devices. Compliant technology also has unique advantages in MEMS applications because compliant mechanisms can be manufactured unitarily, i.e., from a single continuous piece of material, using masking and etching procedures similar to those used to form semiconductors.

In MEMS as well as in other applications, there exists a large need for "bistable devices," or devices that can be selectively disposed in either of two different, stable configurations. Bistable devices can be used in a number of different mechanisms, including switches, valves, clasps, and closures. Switches, for example, often have two separate states: on and off. However, most conventional switches are constructed of rigid elements that are connected by hinges, and therefore do not obtain the benefits of compliant technology. Compliant bistable mechanisms have particular utility in a MEMS environment, in which electrical and/or mechanical switching at a microscopic level is desirable, and in which conventional methods used to assemble rigid body structures are ineffective.

Bistable mechanisms present a unique challenge because the compliant elements must be properly balanced so that two fully stable positions exist. Even if a bistable design is obtained by fortunate guesswork or extensive testing, conventional optimization techniques are often ineffective because the design space is so complex, i.e., highly nonlinear and discontinuous, with such a small feasible space that gradient-driven methods are unable to reach a workable solution. The likelihood that a stochastic method will stumble onto a solution is extremely small in fully compliant designs. Hence, it is difficult to enhance the fully compliant bistable designs, except through additional experimentation.

However, implementation of designs that allow for large displacements of bistable mechanisms can provide for mechanisms that are more predictable and require less experimentation to obtain two stable configurations. Adding pin joints to compliant mechanisms can allow for these large displacements to enable bistability without undue experimentation and analysis. Unfortunately, previous MEMS bistable designs have encountered difficulties with applying pin joints to non-stationary members. Additionally, various attempts of using non-stationary pin joints have encountered motion problems as the result of stiction, the bonding of moveable members to the microchip substrate.

Consequently, it would be an advancement in the art to provide a bistable compliant mechanism, and particularly a bistable compliant mechanism that would have a large displacement to ease design considerations as well as a bistable mechanism that can employ pin joints on moveable structures.

Another problem in the art of bistable and dual positional mechanisms is the inability of these mechanisms to sustain a force that is greater than the force that actuates the mechanism into its stable configurations. To obtain a highly stable mechanism, the mechanism should have the ability to lock to one of two positions. One such stable device is a latching mechanism. Most latching mechanisms provide for interference engagements between two members that will maintain a force larger than the engagement force. However in creating a highly secure and stable configuration, these latching mechanisms often require multiple actuators to both latch and unlatch the mechanism. Further, complex processes and operations are needed to operate these mechanisms that limit the number of applications for latching mechanisms, especially MEMS applications. This subsequently increases the cost and size of the mechanism.

Consequently, it would be an advancement in the art to provide a latching mechanism that could lock and unlock through the use of a single actuator. The latch should also be able to sustain a force larger than the force used to lock the latching mechanism as well as be easy to unlatch.

BRIEF SUMMARY OF THE INVENTION

The present invention provides a micromechanism having a first stable configuration and a second stable configuration. The micromechanism comprises a complaint leg, a base member, and a shuttle. The complaint leg has a base end and a shuttle end, wherein the base end is coupled to the base member via a pin joint and the shuttle end is coupled to the shuttle via a pin joint. In one embodiment, the pin joint that couples the compliant leg to the base member is a fixed pin joint and the pin joint that couples the compliant leg to the shuttle is a floating pin joint.

The bistable micromechanism may be located on a microchip substrate where the base member is fixed to the microchip substrate. The bistable mechanism may further have a plurality of dimples that extend from the bottom of the mechanism. The dimples are configured to elevate the mechanism above the substrate to prevent stiction. The dimples may be located on the floating pin joint, the shuttle, or the leg.

The leg may have any number of shapes to allow the mechanism to be bistable. The leg may be arch, straight, or "V" shaped. Other shapes are possible so long as the shape functions similar to a spring by storing potential energy when compressed. The mechanism operates by increasing potential energy in the leg as it is deflected toward the maximum potential energy position. From the maximum potential energy position, the mechanism may toggle in one of two directions toward one of two low potential energy positions. Thus, the leg may toggle between low potential energy positions, where these two low potential energy positions are separated by the maximum potential energy position.

Another embodiment of the present invention provides for a latching mechanism comprising a grasping member, a lock slider, and a detent slider. The lock slider is configured to induce a locking deflection with respect to the grasping member to reach an engaged position. The lock slider is also capable of inducing an unlocking deflection with respect to the grasping member, where the unlocking deflection is greater than the locking deflection. The detent slider is coupled to the lock slider to selectively maintain the unlocking deflection with respect to the grasping member. This unlocking deflection allows the lock slider to disengage the grasping member and retract to its initial position.

The grasping member may be a compliant mechanism that has a fixed end and a free end that are separated by a generally flexible arm. The free end comprises an engagement member and a disengagement member. The engagement member is configured to engage the lock slider in a locked configuration and the disengagement member is configured to engage the lock slider in an unlocked configuration. The detent slider is operably connected to the lock slider. The lock slider is substantially situated with the perimeter of the detent slider and the detent slider has a raised member that engages a stop that is situated on top of the lock slider. Thus act the lock slider moves, the detent slider will react to its movements as the stops abut the raised member. The mechanism is capable of being actuated by a thermal in-plane microactuator in a MEMS application. The actuator can both lock and unlock the latching mechanism by driving the lock slider in a single direction.

This latching mechanism follows the process of displacing the lock slider a first distance in an actuation direction sufficient to engage a grasping member in a locked configuration. Then the step of displacing the lock slider a second distance in the actuation direction sufficient to deflect the grasping member in an unlocked configuration is performed. Once the grasping members are deflected the step of displacing the lock slider a third distance in the actuation direction sufficient to maintain the grasping member in the unlocked configuration occurs. Then finally, the step of displacing the lock slider a fourth distance in a direction opposite the actuation direction, wherein the third distance is sufficient to disengage the grasping member finishes the processes.

Numerous other embodiments of the bistable mechanism and the latching mechanism may be created through varying parameters of the mechanism. For example, additional leg sets may be added to the bistable mechanism and the type of joints in the mechanism can be varied for different applications. In a latching mechanism the members that induced the locked and unlocked configurations may be varied to create a design that is capable of being placed in a wide variety of locations.

DETAILED DESCRIPTION OF THE INVENTION

The present apparatus and method will be best understood by reference to the drawings, wherein like parts and steps are designated by like numerals throughout. It will be readily understood that the components of the present mechanism, as generally described and illustrated in the Figures herein, could be arranged and designed in a wide variety of different configurations. Thus, the following detailed description of the embodiments of the apparatus and method, as represented in the Figures, are not intended to limit the scope of the claim, but are merely representative of present embodiments of the apparatus and method.

Figure 1:
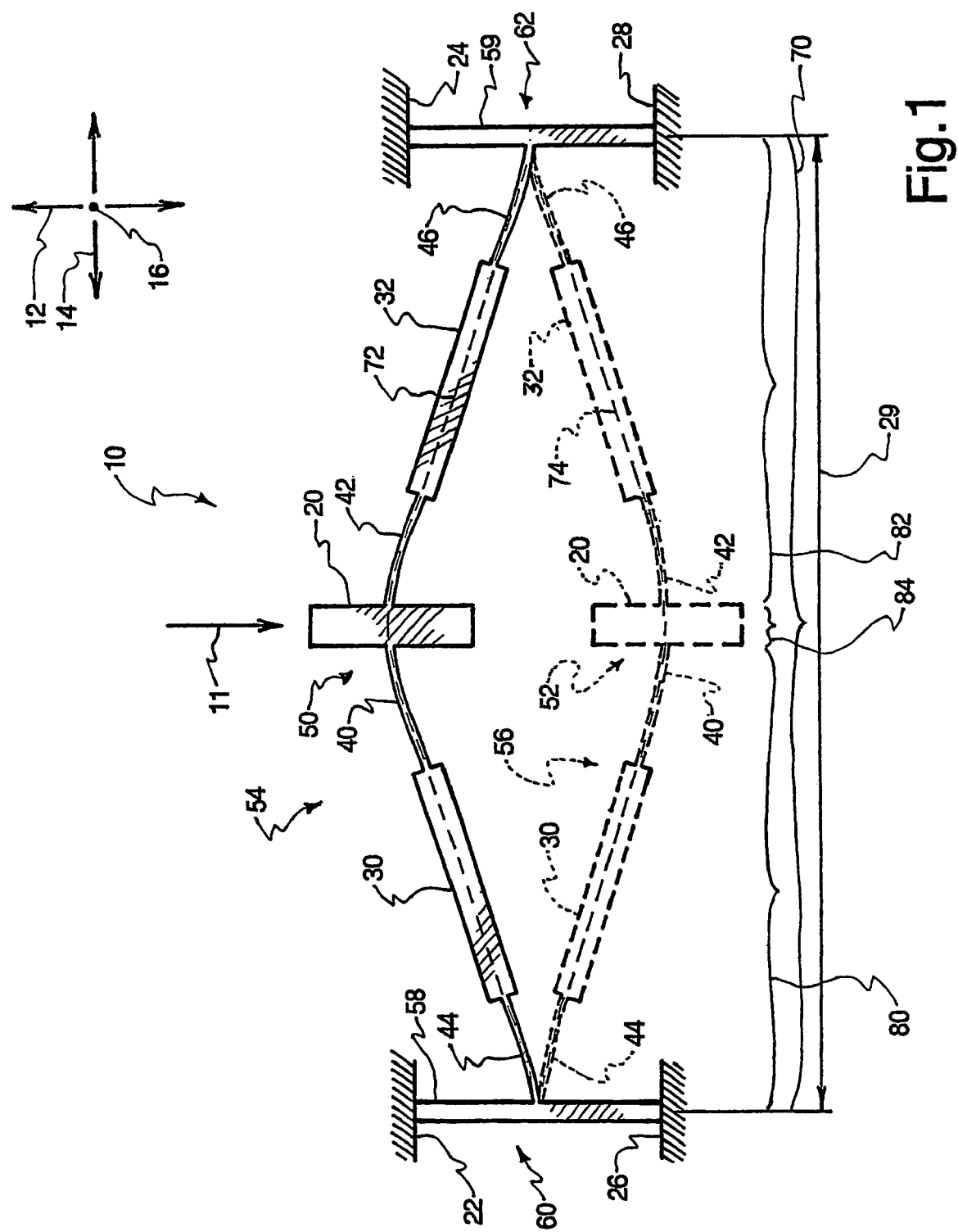
FIG. 1 is a plan view of one embodiment of a compliant bistable mechanism according to the invention.

Referring to FIG. 1, one example of an integrally formed compliant mechanism 10, or mechanism 10, is shown. The mechanism 10 may be sized for MEMS applications. Although many of the examples presented herein apply to MEMS applications, the apparatus and method of the present invention are not limited to MEMS, but are rather applicable to compliant mechanisms in general.

The exemplary mechanism 10 of FIG. 1 is a bistable micromechanism, or a MEMS device that can be actuated between two stable configurations through the application of an input force 11. Such a mechanism may be used to perform microswitching functions or the like. The mechanism 10 may have a longitudinal direction 12, a lateral direction 14, and a transverse or out-of-plane direction 16. The mechanism 10 may have a substantially planar configuration, e.g., all parts of the mechanism 10 may have substantially the same thickness and positioning in the transverse direction 16. The mechanism 10 may have a shuttle 20 configured to receive the input force 11 and, if desired, exert an output force on some other object.

The shuttle 20 may be connected to a first base member 22, a second base member 24, a third base member 26, and a fourth base member 28. The base members 22, 24, 26, 28 may be stationary, or may be affixed to other stationary or mobile MEMS devices. Consequently, the base members 22, 24, 26, 28 are depicted simply as attachment surfaces. The first and third base members 22, 26 may be separated from the second and fourth base members 24, 28 by an offset distance 29. The offset distance 29 may be substantially fixed. The shuttle 20 may be connected to the base members 22, 24, 26, 28 through the use of a first leg 30 and a second leg 32. The legs 30, 32 may be thick enough to be substantially rigid. The exemplary mechanism 10 of FIG. 1 implements two general types of compliant segments, or segments that are designed to provide motion and/or biasing force through deformation.

More specifically, the mechanism 10 may have a first shuttle pivot coupling 40 and a second shuttle pivot coupling 42 that pivotally attach the shuttle 20 to the first and second legs 30, 32. Similarly, the mechanism may have a first base pivot coupling 44 and a second base pivot coupling 46 that pivotally attach the first and second legs 30, 32 with the base members 22, 24, 26, 28. As shown, the pivot couplings 40, 42, 44, 46 take the form of small-length flexural pivots 40, 42, 44, 46, or flexural pivots 40, 42, 44, 46; however, in other embodiments, pin joints or other types of compliant members may be used. The flexural pivots 40, 42, 44, 46 allow the shuttle 20 to travel from a first position 50 to a second position 52 by flexing to provide pivotal motion similar to that of a pin joint. Thus, the mechanism 10 has a first stable configuration 54, or first configuration 54 corresponding to the first position 50 and a second stable configuration 56, or second configuration 56 corresponding to the second position 52.

Generally, small-length flexural pivots are thin cross-sectioned segments that replace traditional pivotal joints while still allowing the joint to be mathematically modeled as a traditional pivotal joint. Small-length flexural pivots bend along their length to allow other elements of a micro-mechanism to move relative to each other. Small-length flexural pivots can have a wide variety of lengths and shapes to suit multiple designs. Longer small-length flexural pivots allow for a large range of motion, while shorter pivots are easier to model with techniques, such as pseudo-rigid body modeling.

To facilitate mathematical modeling of the small-length flexural pivots through methods such as pseudo-rigid body modeling, it is advantageous to form each of the flexural pivots 40, 42, 44, 46 with a length of less than 10% of the length of the legs 30, 32 to which they are attached. However, the length of the flexural pivots 40, 42, 44, 46 must also be sufficiently long to allow the legs 30, 32 to rotate through the necessary angle as the shuttle 20 travels between the first and second positions 50, 52. Therefore, depending on the desired displacement between the first and second positions 50, 52 of the shuttle 20, a 10% ratio of flexural pivot length to leg length may be advantageous. Longer flexural pivots 40, 42, 44, 46 may also be used, but may require the use of more advanced modeling techniques.

The first and third base members 22, 26 may be connected together by a first mounting beam 58, and the second and fourth base members 24, 28 may be connected together to form a second mounting beam 59. The mounting beams 58, 59 may have a length and thickness selected to permit bending in the fixed-fixed configuration. Thus, the first and third base members 22, 26 may operate in conjunction with the first mounting beam 58 to form a first deformable mount 60, and the second and fourth base members 24, 28 may similarly operate in conjunction with the second mounting beam 59 to form a second deformable mount 62. The first and second deformable mounts 54, 56 may be coupled to the legs 30, 32 by the first and second base flexural pivots 44, 46, respectively. The deformable mounts 60, 62 may function similar to springs, in that they elastically deflect when the legs 30, 32 press outward against them.

The motion of the elements of a compliant mechanism is determined by the geometry of the elements. Thin or necked-down members, such as the deformable mounts 60, 62 and the flexural pivots 40, 42, 44, 46, will flex as they receive a load sufficient to cause a deformation or a deflection. Conversely, thick members, such as the legs 30, 32 and the shuttle 20, will remain substantially undeflected under loading of the mechanism 10. Typically, some minor bending will occur in thicker members such as the legs 30, 32 and the shuttle 20; however, such bending is small in comparison to the deflections of the thinner members. The combination of the flexural pivots 40, 42, 44, 46 and deformable mounts 60, 62 with the legs 30, 32 provides the range of motion necessary for the mechanism 10 of FIG. 1 to move between the first configuration 54 and the second configuration 56.

The deformable mounts 60, 62 may be undeflected, or only slightly deflected, when the shuttle 20 is in the first position 50 or the second position 52 so that the first and second configurations 54, 56 are both low potential energy states. However, when the shuttle 20 is disposed between or outside the first and second positions 50, 52, the deformable mounts 60, 62 may be deformed to a larger extent to store a larger amount of potential energy, and thereby provide the impetus for the mechanism 10 to return to the first configuration 54 or the second configuration 56.

Thus, the mechanism 10 obtains its stability in two configurations from the existence of two low potential energy positions. A mechanism implementing low potential energy positions provides better control and a larger range of design possibilities than do bistable mechanisms implementing residual stress or buckled beamed methods. The mechanism 10 of FIG. 1 uses a combination of the flexural pivots 40, 42, 44, 46, the deformable mounts 60, 62, and the legs 30, 32 to create at least two low potential energy positions.

When the shuttle 20 is disposed between the first and second positions 50, 52, the deformable mounts 60, 62 may be bent outward. When the shuttle 20 is disposed outward of the first position 50 or the second position 52, the deformable mounts 60, 62 may be bent inward. Deformable mounts need not be configured in the same manner as the deformable mounts 60, 62 of FIG. 1, but may involve the use of fixed-free cantilever mounting beams, zigzagging flexural segments, or the like, as will be shown and described hereafter.

The mechanism 10 may also be described as a compliant bridge 70 coupled to and integrally formed with the base members 22, 24, 26, 28. The bracket labeled 70 indicates that, in the mechanism 10 of FIG. 1, the compliant bridge 70 includes the shuttle 20, the flexural pivots 40, 42, 44, 46, and the legs 30, 32.

The compliant bridge 70 may be selectively disposable along a first path 72, which corresponds to the first position 50 and the first configuration 54, and a second path 74, which corresponds to the second position 52 and the second configuration 56. The paths 72, 74 may each be longer than the offset distance 29, so that the compliant bridge 70 is curved or kinked in each of the first and second configurations 54, 56. Conversion between the first and second configurations 54, 56 may simply entail reversing the curvature or kinking of the compliant bridge 70.

The compliant bridge 70 is curved or kinked in both configurations 54, 56 because the tendency of the deformable mounts 60, 62 to stay straight is of a higher magnitude than the tendency for the compliant bridge 70 to return to its original state. For example, the mechanism 10 may be manufactured in the first configuration 54, so that there is substantially no deformation of the mechanism 10 in the first configuration 54. Thus, in the second configuration 56, the compliant bridge 70 may be generally bent in a direction opposite to its original, undeflected curvature. The compliant bridge 70 may thus exert outward force against the deformable mounts 60, 62 in the second configuration 56 due to its tendency to return to its undeflected state. The deformable mounts 60, 62 must therefore provide a resilient force sufficient to counteract the outward pressure of the compliant bridge 70 in the second configuration 56, so that the compliant bridge 70 will remain deflected in the absence of any external force.

Such tendencies or strengths are a function of the geometry and positioning of the elements of the mechanism 10. In FIG. 1, the deformable mounts 60, 62 have a thicker width than the flexural pivots 40, 42, 44, 46, so that the deformable mounts 60, 62 have a comparatively strong tendency to remain straight. The resilient forces produced by the deformable mounts 60, 62 and the flexural pivots 40, 42, 44, 46 can be compared to springs with different spring constants. Thicker elements are analogous to springs with large spring constants, and therefore resist deformation more than elements that would be modeled with a smaller spring constant.

The compliant bridge 70 may have a first beam section 80 that generally encompasses the first leg 30, the first shuttle flexural pivot 40, and the first base flexural pivot 44. Similarly, the compliant bridge 70 may have a second beam section 82 that generally encompasses the second leg 32, the second shuttle flexural pivot 42, and the second base flexural pivot 46. The compliant bridge 70 may also have a central portion 84 that includes the shuttle 20.

The curvature of the paths 72, 74 may be somewhat exaggerated in the view of FIG. 1 to distinctly show the first and second configurations 54, 56; the paths 72, 74 may, in reality, be nearly straight. The curvature of the paths 72, 74 may be adjusted to suit the desired force and displacement characteristics of the mechanism 10. Additionally, multiple other factors may also be adjusted to modify the operation of the mechanism 10.

When the input force 11 is applied to the shuttle 20, the shuttle 20 is moved toward the second position 52, thereby pressing the deformable mounts 60, 62 outward. The deformable mounts 60, 62 flex outward to accommodate the increased length of the compliant bridge 70 as the compliant bridge 70 deflects toward a straight configuration. The potential energy present in the mechanism 10 increases as the legs 30, 32 approach a linear alignment; maximum potential energy may be reached at or near the point at which the compliant bridge 70 becomes completely straight.

The maximum potential energy position is the toggle point. At the toggle point, the compliant bridge 70 is in an unstable equilibrium, in which the compliant bridge 70 is equally biased between the first and second configurations 54, 56, each of which has a low potential energy. A slight displacement toward either of the configurations 54, 56 will snap the compliant bridge 70 into one of the configurations 54, 56. If continued force is applied in the direction indicated by the input force 11, the compliant bridge 70 will be urged to bend by the deformable mounts 60, 62 as the deformable mounts 60, 62 relax into a comparatively straight, undeformed, configuration to provide the second stable configuration 56. The deformable mounts 60, 62 may not fully relax in the second configuration 56 due to the continued outward force exerted by the compliant bridge 70.

To actuate the mechanism 10 back to the first configuration 54, a return force, or a load sufficient to deflect the compliant bridge 70 beyond the toggle point, towards the first stable position 54, need only be applied in a direction opposite to that of the input force 11. The magnitude of the return force required to return the mechanism 10 to the first configuration 54 need not be equal to the magnitude of the input force 11 required to actuate the mechanism 10 into the second configuration 56. Indeed, the input force 11 and the return force may be specifically designed to suit the application in which the mechanism 10 is used.

Through the use of compliant technology, a bistable mechanism may be produced without conventional, separate members and joints. The functions of such members and joints are instead carried out by integrally formed elements that allow for motion similar to that of conventional mechanism. While a compliant structure can provide motion and displacement similar to that of designs involving conventional rigid elements, the design process for a compliant mechanism has obstacles not present in the case of conventional mechanisms utilizing separate, rigid parts. For example, the deformable mounts 60, 62 not only serve as spring-type elements to bias the shuttle 20 toward the first position 50 or the second position 52, but they also function as attachments for the first and second base flexural pivots 44, 46. Thus, multiple forces and torques simultaneously act on the deformable mounts 60, 62. Additionally, comparatively large deflections may occur.

As a result, determining how the material flexes requires complex non-liner equations. The complexity of these equations makes it difficult to obtain closed form mathematical relationships between geometric characteristics of the mechanism 10 and the resulting operational characteristics. "Geometric characteristics" refers to physical properties of a compliant structure, including member dimensions, member positions, and material properties. Hence, with traditional methods, it is difficult to create a compliant structure that functions in the desired manner, let alone optimize the structure for a desired function. As mentioned previously, the present invention presents a system and method whereby compliant structures in general can be designed and optimized without the computationally intensive procedures that have been necessary in the past.

More specifically, the process of designing and optimizing a compliant structure can be simplified by modeling a compliant structure as a mechanism with rigid members connected with conventional joints and springs. Such a model may be called a "pseudo-rigid body model," which will be referred to as an analytical model in the following discussion.

Figure 2:
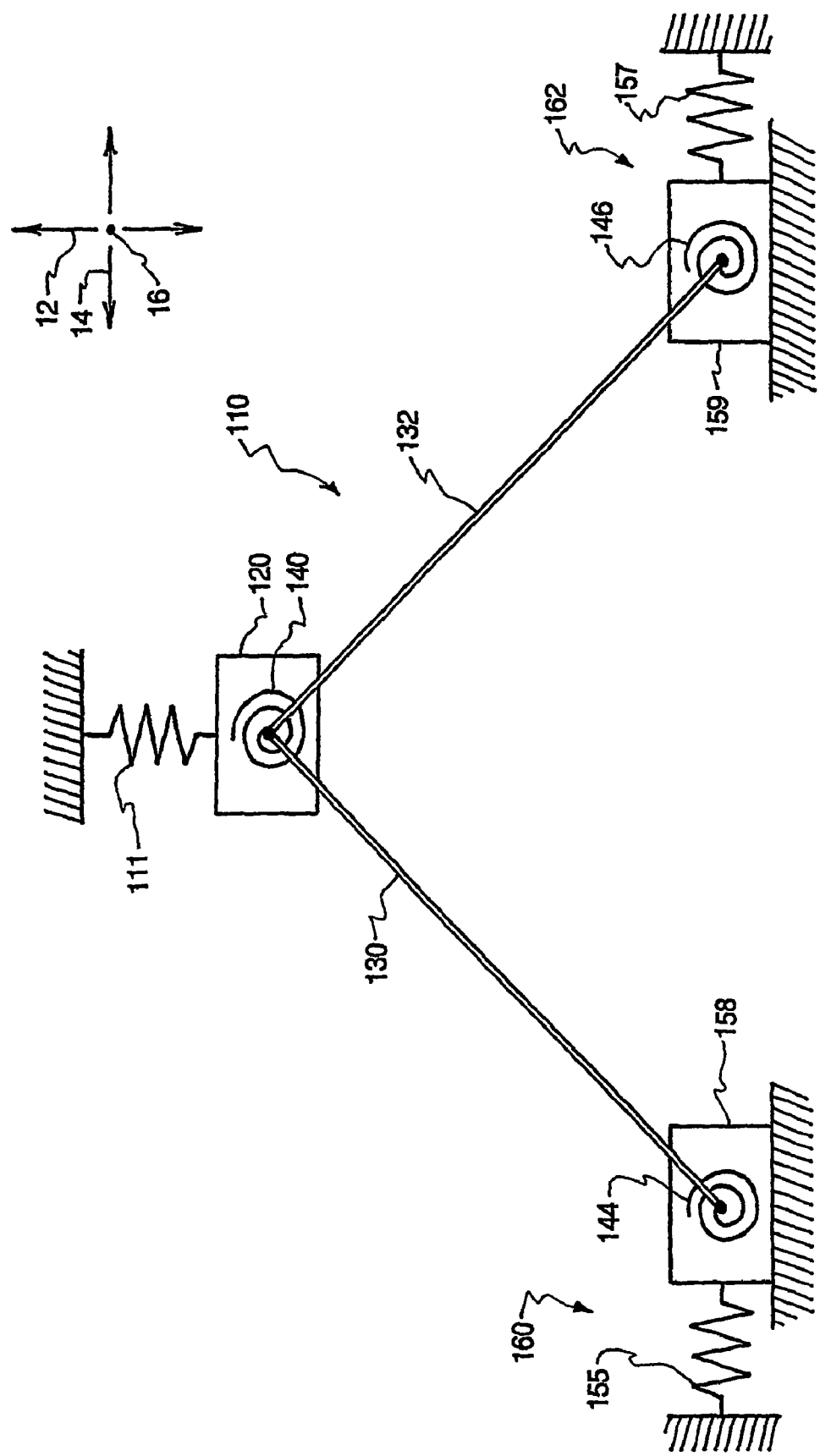
FIG. 2 is a plan view of an analytical model to approximate the operation of the bistable mechanism of FIG. 1.

Referring to FIG. 2, an analytical model 110 of the mechanism 10 of FIG. 1 is depicted. Each elements of the mechanism 10 is present in the analytical model 110. More specifically, the input force 11 may be modeled as a longitudinal spring 111 with a linear configuration. Such a force may be applied by an actuator affixed to the shuttle 20, which may resist longitudinal motion of the shuttle 20 in either direction until the actuator is triggered. However, if the input force 11 does not vary in linear fashion with the displacement of the shuttle 20, some other model may be more appropriate. For example, if the shuttle 20 is part of an accelerometer and is actuated only by its own weight, the longitudinal spring 111 may be removed entirely from the analytical model 110, or negated by setting its spring constant to zero. The shuttle 20 may be represented by a longitudinal slider 120 that moves only in the longitudinal direction 12 by virtue of the symmetry of the model 110.

The legs 30, 32 may be modeled as legs 130, 132, which are connected by pin joints and torsional springs. More precisely, the first and second shuttle flexural pivots 40, 42 may be modeled with a single pin joint/torsional spring combination 140 on the slider 120. The torsional spring of the pin joint/torsional spring combination 140 represents the resistance of the shuttle flexural pivots 40, 42 to bending. The first and second base flexural pivots 44, 46 may be modeled as first and second pin joint/torsional spring combinations 144, 146 attached to the legs 130, 132. The torsional springs of the pin joint/torsional spring combinations 144, 146 represent the resistance of the base flexural pivots 44, 46 to bending.

The resilient force of the first mounting beam 58 may be represented by a first lateral spring 155, and the resilient force of the second mounting beam 59 may be represented by a second lateral spring 157. The pin joint/torsional spring combinations 144, 146 may be attached to first and second lateral sliders 158, 159, respectively, which represent the physical attachment provided by the first and second mounting beams 58, 59. The lateral sliders 158, 159 may be constrained to move in the lateral direction 14 by the longitudinal symmetry of the deformable mounts 60, 62. The combination 160 of the first lateral spring 155 with the first lateral slider 158 may be analogous to the first deformable mount 60, and the combination 162 of the second lateral spring 157 with the second lateral slider 159 may be analogous to the second deformable mount 162.

The analytical model 110 has many "analytical model characteristics," each of which can be changed to alter the operational characteristics of the model 110. The analytical model characteristics are analogous to the geometric characteristics of the compliant structure. For example, the legs 130, 132 each have a length and a rest angle with respect to the lateral direction 14. Each of the pin joint/torsional spring combinations 140, 144, 146 may have a spring constant that indicates the strength of the torsional spring. Each of the linear springs 111, 155, 157 may also have spring constants.

Mathematical relationships between the analytical model characteristics and operational characteristics of the analytical model 110 may be determined using traditional tools of kinematic analysis. The analytical model characteristics may be altered to simulate different configurations of the mechanism 10 in its compliant form.

This type of pseudo-rigid body modeling can be applied to many different compliant structures besides bistable micromechanisms. After creating an analytical model of the compliant structure, conventional techniques can be applied to the analytical model to obtain closed form equations that relate operational characteristics to analytical model characteristics, such as the dimension, orientation, stress, force, thickness, or width. When the desired analytical model characteristics have been determined, a compliant design may be produced so that comparable operational characteristics can be obtained. This process of creating an analytical model of a compliant structure and then characterizing the structure with conventional rigid body equations allows for a large number of candidate designs to be considered for any given application. Additionally, once a feasible analytical model is determined, the model may be optimized to make the structure perform a specific function in a predetermined manner.

The initial step in optimizing a compliant structure is to determine the desired operational characteristics of the mechanism. For example, the maximum stress on the structure elements, such as the small-length flexural pivot, must be lower than the yield strength of the material to prevent failure. As another example, it may be desirable to minimize an input force, maximize an output force, maximize an output displacement, or obtain some other objective characteristic.

The mechanism 10 in FIG. 1 may be designed through the use of such an optimization process. The mechanism 10 has several geometric characteristics that must be considered when performing an optimization process. First, the mechanism 10 is to be stable in two different configurations 54, 56. Bistable design can be difficult to achieve because of the complexity inherent in compliant mechanisms; the interactions of flexible members, analysis of large deformations, and the like make it difficult to determine which sets of geometric characteristics will provide a bistable design. However, through the use of an analytical model like that of FIG. 2, multiple bistable configurations may be found.

More specifically, certain ranges of analytical model characteristics may be determined to yield bistable operation; such ranges may then form the parameters of further analysis to select the best specific configuration. Which bistable configuration is the best depends on the desired operational characteristics. One operational characteristic may be selected and designated an "objective characteristic," or the operational characteristic that is to be obtained through the optimization process. The objective characteristic may be a target value, such as a desired threshold input force to move the mechanism 10 from the first configuration 54 to the second configuration 56. In the alternative, the objective characteristic may be a value that is to be maximized or minimized; for example, the displacement of the shuttle 20 between the first and second positions 50, 52 may be minimized.

Figure 3:
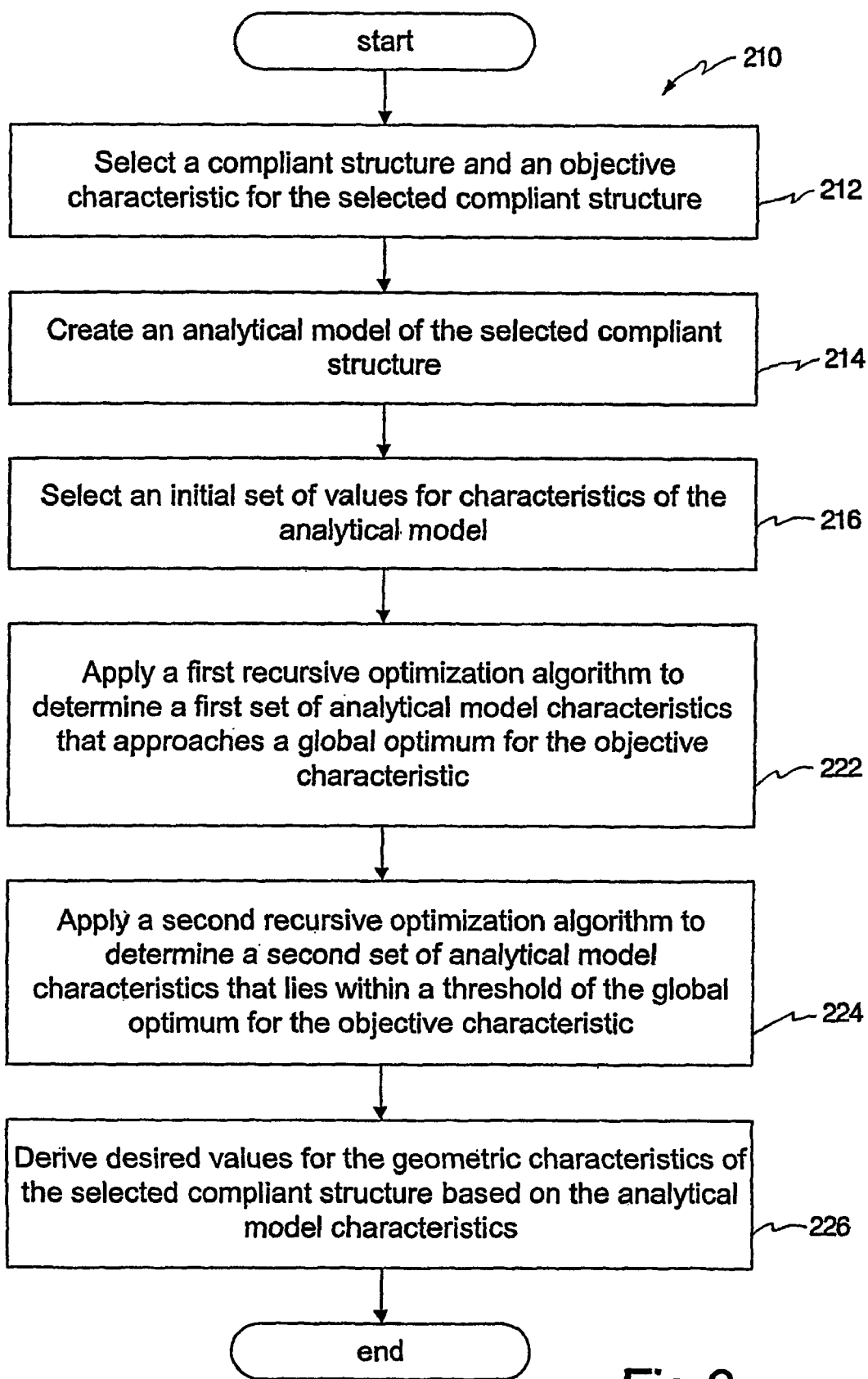
FIG. 3 is a flowchart diagram showing one embodiment of an optimization process for compliant mechanisms.

Referring to FIG. 3, a flowchart depicts one example of an optimization process 210 according to the present invention. As mentioned previously, the optimization process 210 is applicable not only to bistable mechanisms or MEMS, but can be used for compliant mechanisms in general. As described previously, the first step may be to select 212 a compliant structure, such as the mechanism 10 of FIG. 1, and an objective characteristic to be optimized. For the mechanism 10, the objective characteristic may be the displacement between the first and second positions 50, 52 of the shuttle 20. Alternatively, a plurality of objective characteristics may be selected and simultaneously optimized.

After the compliant structure and the objective characteristic have been chosen, an analytical model, such as the model 110 of FIG. 2, may be created 214. Traditional analysis of rigid body members may be used to obtain mathematical relationships that relate the objective characteristic to characteristics of the analytical model, such as member lengths and angles, spring constants, and the like. Such mathematical relationships may consist of closed form equations that can be readily applied by a computer in an iterative process.

Alternatively, a compliant structure may be optimized without using an analytical model if a different form of analysis is used. For example, the compliant structure may be modeled by computer through the use of finite element analysis or a similar method. Finite element analysis creates a geometric model of the compliant structure by dividing the compliant structure into a large number of small geometric shapes, such as tetrahedrons. A computer then utilizes an iterative process involving simultaneous sets of equations to determine how the structure will respond to loads.

Thus, the finite element method may be used to evaluate multiple configurations of the selected compliant structure without creating closed form mathematical relationships. However, finite element analysis is computationally intensive, and would have to be performed with each iteration of an optimization algorithm. Consequently, optimization through finite element analysis may be too time consuming to be practical. Therefore, the following discussion assumes the use of an analytical model.

Returning to FIG. 3, once the analytical model has been created 214, initial values of the characteristics of the analytical model should be selected 216. The initial values may simply be a guess as to what may be close to the optimal values of the analytical model characteristics; such a guess may be made through analysis of the model, experimentation, or experience.

A first recursive optimization algorithm may then be applied 222 to the analytical model. In general, the first recursive optimization algorithm takes the initial set of values for the analytical model characteristics and performs an iterative process to approach a global optimum, or a set of analytical model characteristics that will produce the most desirable value of the objective characteristic. In the exemplary process 210 of FIG. 4, the main purpose of applying 222 the first recursive optimization algorithm is not necessarily to find the global optimum itself, but to find the general region in which the global optimum lies among local optima. This concept will be illustrated with greater clarity in FIG. 4.

The first recursive optimization algorithm may return a first set of values of the analytical model characteristics; the first set of values bring the objective characteristic near a global optimum. A second recursive optimization algorithm may then be applied 224. The second recursive optimization algorithm may receive the first set of values of the analytical model characteristics and may perform iterative steps to obtain a second set of values of the analytical model characteristics that provide a value of the objective characteristic within a tighter threshold of the global optimum. The threshold is necessary because the second recursive optimization algorithm may otherwise come infinitely close to the global optimum without actually reaching it.

Once the second set of analytical model characteristics has been obtained, the analytical model characteristics are utilized to derive 226 the geometric characteristics of the selected compliant structure that will obtain a similar result. Derivation of the geometric characteristics from the analytical model characteristics may be accomplished by utilizing known relationships between compliant structures and their rigid body approximations. For example, a torsional spring constant from the analytical model 110 may be used to determine a thickness for a small-length flexural pivot so that the small-length flexural pivot simulates the torsional spring constant in operation. Other geometric characteristics, such as member lengths, materials, member angles, and the like may be determined in a similar manner, i.e., by comparison with the second set of values of the analytical model characteristics.

The optimization process 210 is only one example of an optimization method according to the present invention; many other processes may also be used. As mentioned above, a different method of analysis, such as the finite element method, may be used in place of creating 214 the analytical model. Additionally, rather than applying 222 a first recursive optimization algorithm and applying 224 a second recursive optimization algorithm, a single optimization algorithm may be used to approach the global optimum and come within the threshold value.

Figure 4:
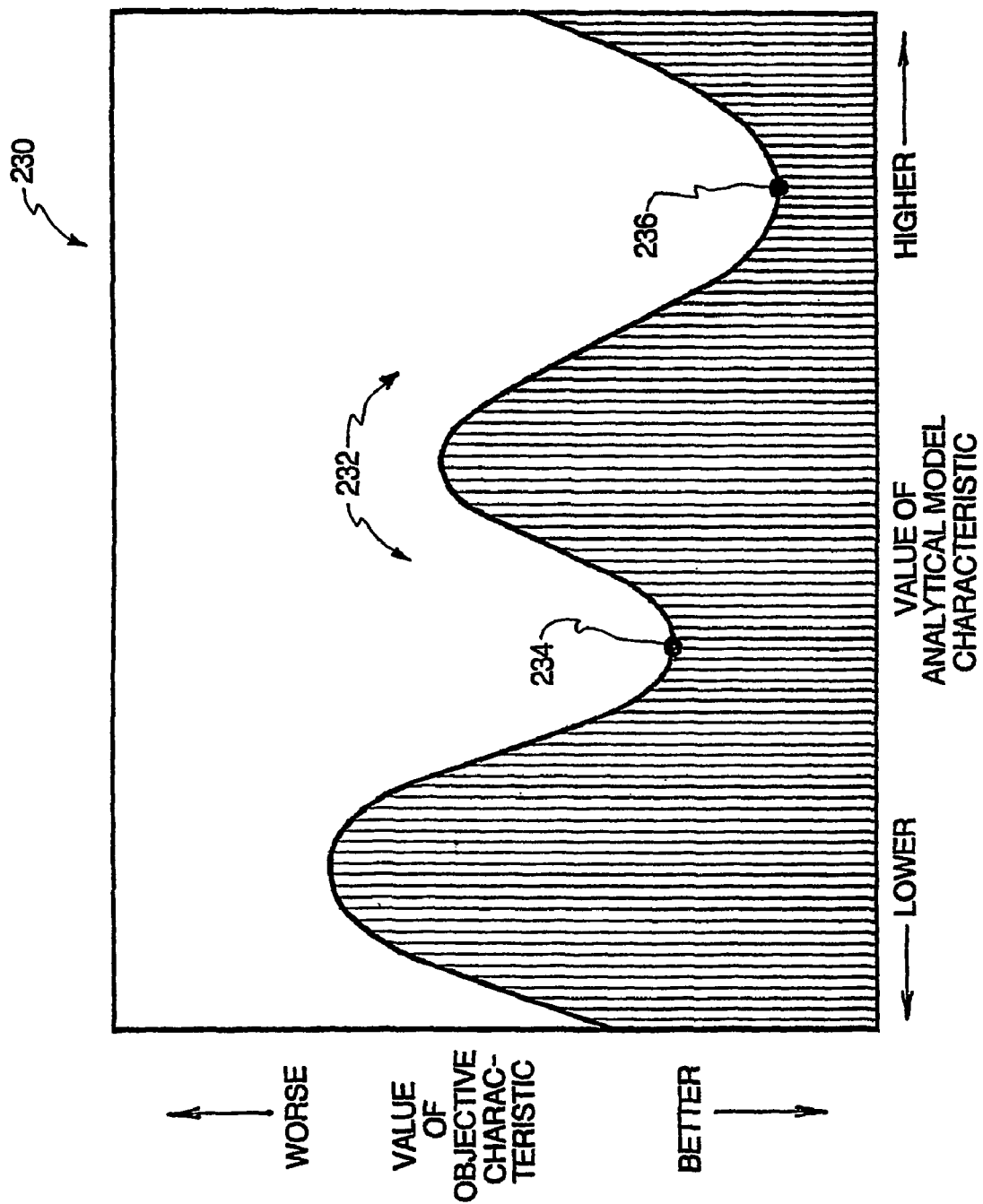
FIG. 4 is a graph showing a local optimum and a global optimum for an objective characteristic to be optimized over a single analytical model characteristic.
Figure 5:
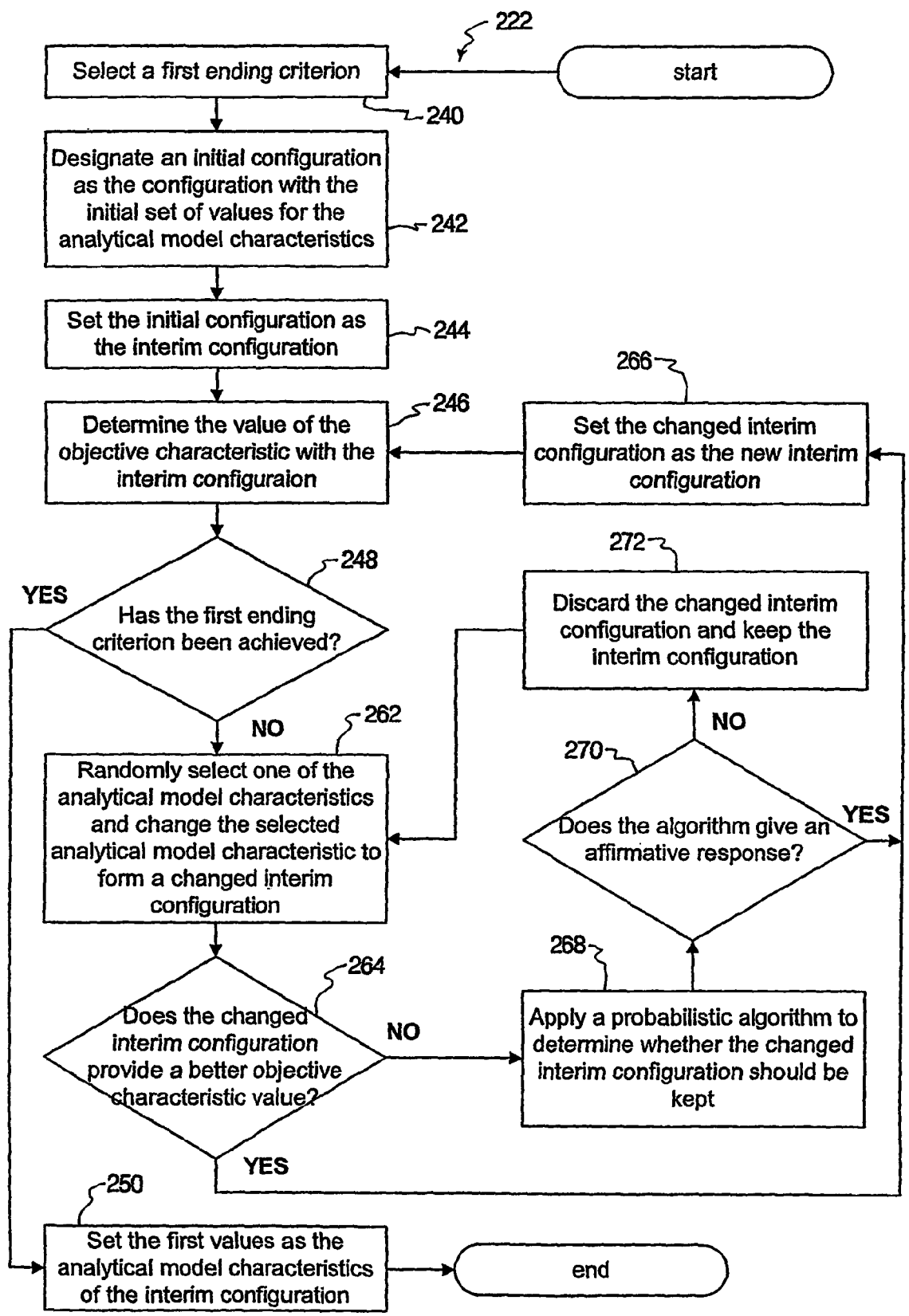
FIG. 5 is a flowchart diagram showing one embodiment of a first recursive optimization algorithm suitable for the optimization process of FIG. 3.
Figure 6:
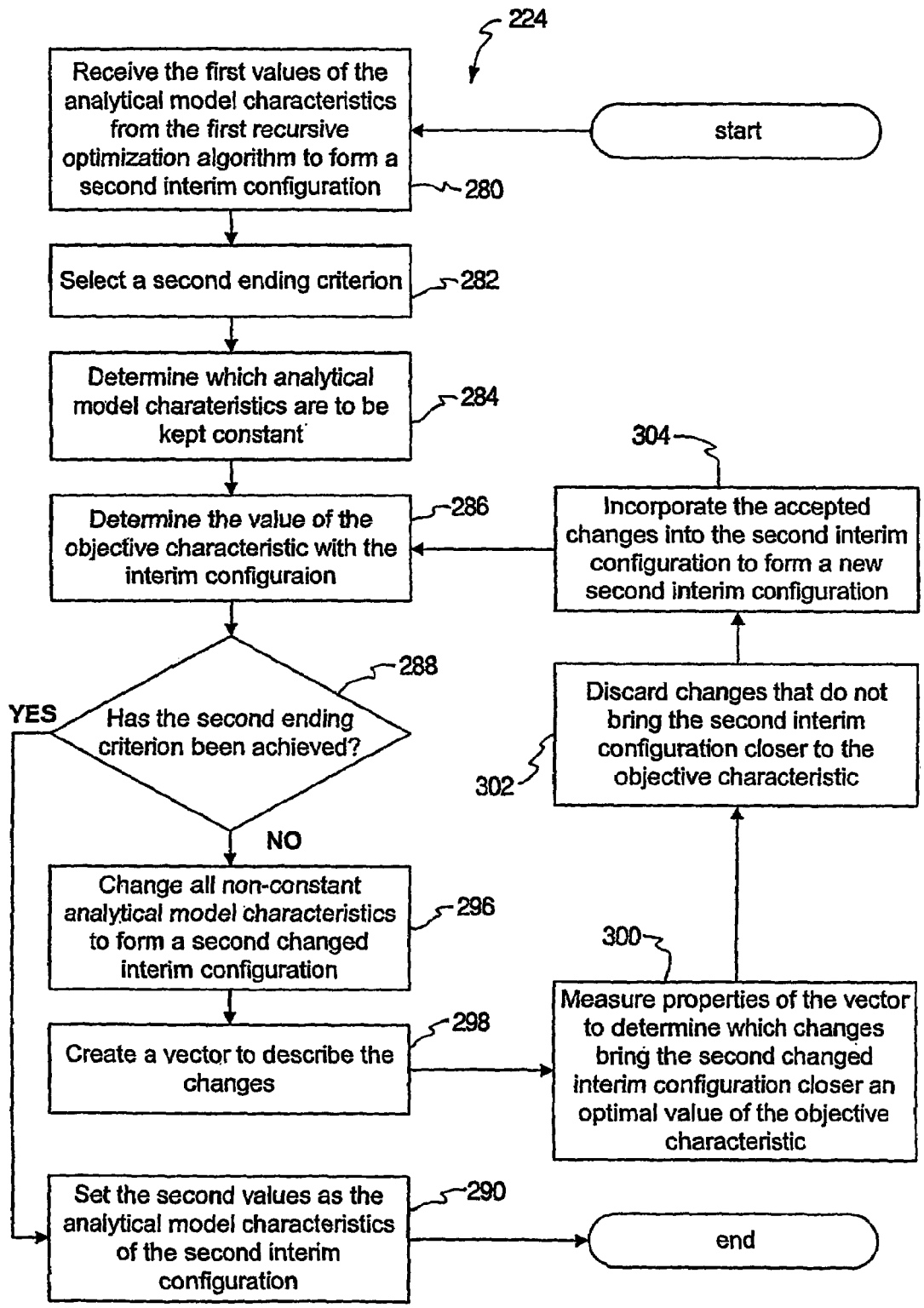
FIG. 6 is a flowchart diagram showing one embodiment of a second recursive optimization algorithm suitable for the optimization process of FIG. 3.

Hence, steps of the optimization process 210 may generally be omitted, modified, and/or added to create new embodiments. However, the following discussion is based on the optimization process 210. FIG. 4 is a graphical illustration of local and global optima; FIG. 5 provides additional detail regarding the operation of one embodiment first recursive optimization algorithm, and FIG. 6 provides additional detail regarding the operation of one embodiment of the second recursive optimization algorithm.

Referring to FIG. 4, a graph 230 shows the value of the objective characteristic, mapped against the value of one analytical model characteristic. Although optimization will most likely be carried out by varying multiple analytical model characteristics, the two-dimensional representation of FIG. 4 is somewhat easier to describe and understand. Those of skill in the art will recognize that the principles described below are equally applicable to optimization processes in which multiple characteristics are simultaneously changed.

The vertical axis represents the value of the objective characteristic, such as the actuation force required to move the shuttle 20 of the mechanism 10 of FIG. 1, between the first and second positions 50, 52. In this embodiment, it is desirable for the actuation force to be as low as possible. The horizontal axis represents the value of the analytical model characteristic that is to be varied to optimize the objective characteristic. The domain depicted by the horizontal axis represents the feasible design area for the analytical model characteristic that is to be varied.

As shown in FIG. 4, there are multiple valleys 232 in which feasible designs come to relatively low (i.e., desirable) values of the objective characteristic. One of the valleys 232 contains a local optimum 234, which is a lowest value of the objective characteristic within the valley 232 in which the local optimum 234 is present. The other valley 232 contains a global optimum 236, which is a lowest value of the objective characteristic within the entire feasible range of the analytical model characteristic. If a high value of the objective characteristic were desirable, local and global optima may be peaks instead of valleys.

If the optimization process is not robust enough, the optimization algorithm may only obtain a local optimum, which would produce a less desirable design. Many optimization algorithms tend to return the optimum closest to the initial value provided to the algorithm. Consequently, if the initial value of the analytical model characteristic falls within the valley 232 in which the local optimum 234 resides, such an optimization process would likely return only the local optimum 234, without finding the global optimum 236 that provides the best solution.

In order to avoid the local optimum problem, the optimization process 210 of FIG. 3, applies 222 the first recursive optimization algorithm primarily for the purpose of escaping from local optima, such as the optimum 234. The optimization process 210 then applies 224 the second recursive optimization algorithm to find the value of the analytical model characteristic that will be within a smaller threshold of the global optimum 236.

Referring to FIG. 5, a more detailed flowchart depicts steps that may be followed to apply 222 the first recursive optimization algorithm. The first recursive optimization algorithm may be any algorithm known in the art of mechanical design. As mentioned previously, the first recursive optimization algorithm may be used alone, if desired. The following discussion simply provides an example of one first recursive optimization algorithm that may be used in conjunction with a second recursive optimization algorithm to obtain robust and accurate results.

More precisely, the first recursive optimization algorithm may comprise a process known as simulated annealing. Other stochastic methods, such as genetic algorithms, neural networks, and the like may also be used; however, the following discussion assumes that simulated annealing is the selected method. The simulated annealing process utilizes random decision-making to ensure that the process is able to move between the valleys 232. A first ending criterion may first be selected 240. The first ending criterion may be a required value of the objective characteristic that must be obtained or passed in the positive or negative direction, a maximum number of iterations, a maximum change in the objective characteristic per iteration, or the like. An initial configuration may then be designated 242 as the configuration with the initial set of values that were selected 216 previously.

The initial configuration may be set 244 as the interim configuration. The value of the objective characteristic 246 may then be determined for the interim configuration. The value of the objective characteristic may be obtained through the use of closed form equations from an analytical model of the selected compliant structure, from a computerized process such as finite element analysis, or even through solving the complex equations involved with direct analysis of the selected compliant structure.

Once the value of the objective characteristic has been determined, the first recursive optimization algorithm may then determine 248 whether the first ending criterion has been achieved. As mentioned above, the first ending criterion may take a wide variety of forms, and may be tied to the value of the objective characteristic. If the first ending criterion has been achieved, the first recursive optimization algorithm may then set 250 the first values for the analytical model characteristics as the values of the interim configuration. The first values may then be returned by the first recursive optimization algorithm.

If the first ending criterion has not been achieved, the first recursive optimization algorithm may then randomly select 262 one of the analytical model characteristics and change the selected analytical model characteristic to form a changed interim configuration. Not all of the analytical model characteristics need be subject to change; some may be designated as characteristics to be held constant. The magnitude of the change may also be randomly determined if desired, or may be based in whole or in part on factors such as the results of previous iterations, the type of analytical model characteristic that has been selected at random, or the like. The first recursive optimization algorithm may then determine 264 whether the changed interim configuration provides a better value of the objective characteristic than the original interim configuration.

In order to determine 264 which configuration is preferable, the value of the objective characteristic may be calculated or retrieved, if it has already been determined and stored, for the interim configuration and for the changed interim configuration. For example, if the objective characteristic is minimization of the actuation force, whichever configuration provides the lowest actuation force provides the best value of the objective characteristic.

If the changed interim configuration provides the better result, the changed interim configuration may be unconditionally set 266 as the new interim configuration. The old interim configuration may be discarded. The value of the objective characteristic may then be determined 246 with the new interim configuration to begin the cycle again.

If the changed interim configuration does not provide the better result, a probabilistic algorithm may be applied 268 to determine whether the changed interim configuration should be kept. The probabilistic algorithm may be as simple as the computer equivalent of a coin toss, or may be based in whole or in part upon other factors such as the difference between the values provided by the two configurations, the history of the recursive process, or the like. The first recursive optimization algorithm may determine 270 the results of the algorithm, and if the probabilistic algorithm dictates that the changed interim configuration is to be kept, the changed interim configuration may be set 266 as the new interim configuration.

The probabilistic algorithm may also dictate that the changed interim configuration should be discarded 272, in which case the old interim configuration is kept, and the cycle may begin again. Reiteration with the same interim configuration will not necessarily yield the same result with each iteration because the first recursive optimization algorithm may randomly select 262 the analytical model characteristic to change, and possibly even the magnitude of the change. In all likelihood, the interim configuration will be redefined numerous times throughout the optimization process. Once the first ending criterion has been met, the first values 250 are set as the values of the interim configuration.

The random acceptance or rejection of an inferior interim configuration allows the first recursive optimization processes to escape local optima. As can been seen in FIG. 4, were a configuration to be within the valley 232 of a local optimum 234, an optimization process may need to select a number of inferior designs in order to find the global optimum 236. In the case of the simulated annealing method, the algorithm that selects or rejects an inferior design may be based upon a cooling schedule of metal. The annealing processes would select fewer and fewer inferior designs as the process cycled. The probabilistic algorithm applied by the first recursive optimization algorithm may operate in a similar manner.

After the first recursive optimization algorithm has been applied 222, a first set of values of the analytical model characteristics may be returned by the first recursive optimization algorithm. The first set of values may simply be one set of values that positions the objective characteristic somewhere within the valley 232 in which the global optimum 236 resides. The second recursive optimization algorithm may then be applied 224 to obtain a second set of values that are within a specified threshold of the global optimum 236.

Referring to FIG. 6, a more detailed view of the operation of the second recursive optimization algorithm is depicted. The second recursive optimization algorithm need not be designed to avoid local optima, but may simply operate to remain within the valley 232 in which the first values of the analytical model characteristics lie. Consequently, gradient analysis may be effectively used in conjunction with the second recursive optimization algorithm. Consequently, the second recursive optimization algorithm may comprise the generalized reduced gradient method or a similar optimization process. Other gradient-driven methods, such as sequential quadratic programming, linear programming, and the like, may also be used, but the following discussion assumes the use of the generalized reduced gradient method.

The second recursive optimization algorithm may first receive 280 the first values of the analytical model characteristics, and designate a second interim configuration as the configuration having analytical model characteristics with the first values. A second ending criterion may then be selected 282. Like the first ending criterion, the second ending criterion may take a variety of forms, and may be based upon the value of the objective characteristic.

The second ending criterion may be somewhat more restrictive than the first ending criterion; for example, the second ending criterion may require a comparatively small threshold distance between the global optimum 236 and the value of the objective characteristic. Such a criterion may be measured, for example, by measuring the differences between the values of the objective characteristics in successive iterations. Very small differences may indicate that the value of the objective characteristic that is obtained is near the global optimum 236.

The second recursive optimization algorithm may then determine 284 which analytical model characteristics are to be kept constant during iteration. Changing a larger number of the analytical model characteristics may provide a better result because each additional dimension of the analysis provides the possibility for a lower global optimum. For example, if the graph 230 of FIG. 4 were expanded to three dimensions, the new dimension may well provide a global optimum more desirable than the global optimum 236 that is available through variation of only one of the analytical model characteristics. However, changing a smaller number of analytical model characteristics may expedite the procedure, and may avoid introducing geometric characteristics that are not viable from a manufacturing standpoint.

The value of the objective characteristic may then be determined 286 with the second interim configuration. The second recursive optimization algorithm may then determine 288 whether the second ending criterion has been achieved. If so, the second values may be set 290 as the values of the analytical model characteristics of the second interim configuration. If the second ending criterion has not been met, all of the values of the non-constant analytical model characteristics may be changed to provide a second changed interim configuration. The changes may have a random component, or may be determined entirely by factors such as the effects of changes in past iterations on the objective characteristic.

A vector may then be created 298 to describe the changes made to the analytical model characteristics. The vector may take the form of an ordered number set including all changes made. Properties of the vector may be measured 300 to determine which changes are improvements and which are not, e.g., which changes bring the second changed interim configuration comparatively closer to the global optimum 236. Such properties may be measured through the use of partial derivatives; the partial derivative of each analytical model characteristic with respect to the objective characteristic indicates the effect that changes to that analytical model characteristic have on the objective characteristic.

After the vector has been analyzed, the changes that have not had a positive influence on the second interim configuration may be discarded 302. The remaining changes may be incorporated 304 into the second interim configuration to form a new second interim configuration. Thereafter, the process may continue cyclically until the second ending criterion has been achieved.

The result of the second recursive optimization algorithm is to provide the second set of values of the analytical model characteristics, which will provide the globally optimum value for the objective characteristic within a comparatively tight threshold. If desired, such a result could be obtained solely with the first recursive optimization algorithm. However, the randomized nature of the simulated annealing algorithm may make accurate determination of the global optimum a comparatively time-consuming process. Thus, the use of the second recursive optimization algorithm may make the optimization process faster and more accurate.

As mentioned previously, design and optimization methods presented herein are applicable to a wide variety of compliant mechanisms besides the mechanism 10 of FIG. 1. Additionally, bistable MEMS devices according to the invention may be designed in other ways besides those outlined in FIGS. 3, 5, and 6. Many bistable configurations are possible aside from the mechanism 10 of FIG. 1. Some such configurations will be shown and described in connection with FIGS. 7 through 10.

Figure 7:
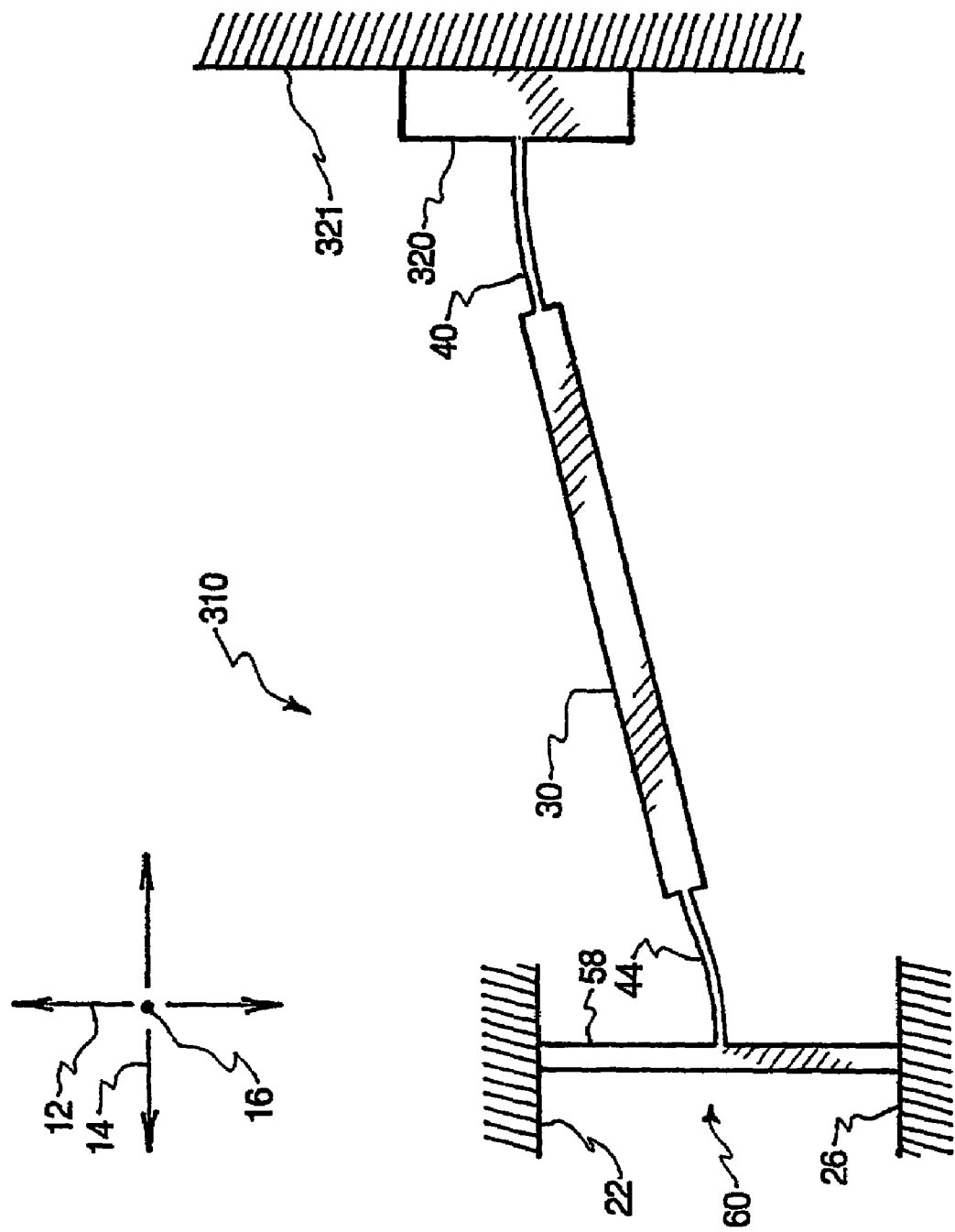
FIG. 7 is a plan view of an alternative embodiment of a compliant bistable mechanism according to the invention.

Referring to FIG. 7, an alternative embodiment of a mechanism 310 with bistable properties is depicted; the mechanism 310 may also be sized for MEMS applications. The mechanism 310 of FIG. 7 may have elements similar to those of the mechanism 10 of FIG. 1; however, the mechanism 310 may not have dual, laterally symmetrical portions. The mechanism 310 may, for example, have a shuttle 320 disposed to move in the longitudinal direction 12, much like the shuttle 20 of FIG. 1. The first and third base members 22, 26, the first leg 30, the first shuttle flexural pivot 40, the first base flexural pivot 44, and the first mounting beam 58 may be substantially as shown and described in connection with FIG. 1. As with FIG. 1, the first base member 22, the third base member 26, and the first mounting beam 58 may form the first deformable mount 60.

The shuttle 320 may be integrally formed with and coupled to the first shuttle flexural pivot 40. However, in place of the second shuttle flexural pivot 42, the shuttle 320 may simply abut a surface 321 against which the shuttle 320 is able to slide. Thus, the lateral distance between the first deformable mount 60 and the shuttle 320 is fixed. The shuttle 320 is constrained to move longitudinally, like the shuttle 20 of FIG. 1; consequently, the shuttle 320 may move in a manner similar to the shuttle 20.

The first deformable mount 60 may flex outward as the shuttle 320 moves toward the toggle point in order to accommodate the aligned lengths of the shuttle 320, the first leg 30, and the flexural pivots 40, 44. The shuffle 320 may be then snap into one of two low potential energy positions as the first deformable mount 60 pushes inward, toward its undeformed configuration. The mechanism 310 is simple in design, and may be actuated between stable configurations with about half the input force required to actuate the mechanism 10, assuming that the displacement of the shuttle 320 between low potential energy positions is the same as that of the shuttle 20, and that the surface 321 provides negligible friction. A low input force may be beneficial for some applications, but may also cause instability in other applications.

Stability is generally proportional to the force required to toggle a bistable mechanism from one low potential energy configuration to another low potential energy configuration. An embodiment requiring a small force to toggle the mechanism is not as stable as a mechanism that requires a large force. Nevertheless, a highly stable mechanism will require a comparatively larger force to actuate the mechanism between different stable configurations. A high input force may place excessive energy burdens on a system, especially in MEMS applications, in which energy consumption is limited. In such applications, minimizing the toggle force may be desirable.

However, stability may be compromised if the toggle force is too low. For example, vibrations that occur from outside the system may toggle a bistable mechanism with a small input force requirement. Therefore, the application and energy requirements must be considered when selecting a bistable mechanism design. One method of increasing stability is to increase the number of legs in the bistable mechanism. Increasing the number of legs also increases the input force required to toggle the mechanism.

Figure 8:
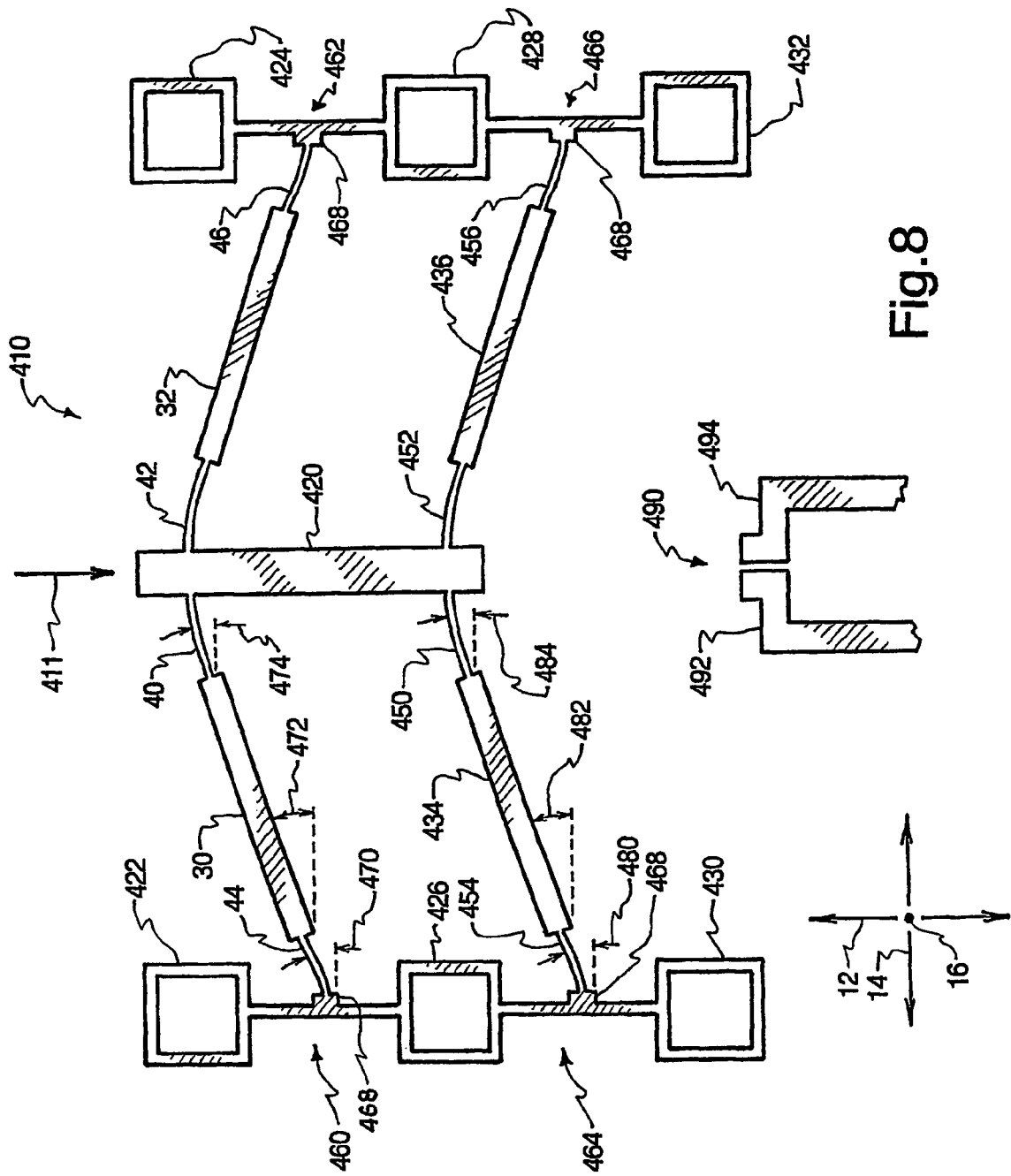
FIG. 8 is a plan view of another alternative embodiment of a compliant bistable mechanism according to the invention.

Referring to FIG. 8, another embodiment of a mechanism 410 according to the invention is depicted; the mechanism 410 may also be sized for MEMS applications, and may also be bistable. As depicted in FIG. 8, the mechanism 410 may receive an input force 411, and may have a shuttle 420 disposable between two stable positions. The shuttle 420 may be connected to a first base member 422, a second base member 424, a third base member 426, a fourth base member 428, a fifth base member 430, and a sixth base member 432.

The shuttle 420 may be coupled to the first and third base members 422, 426 by a first leg 30 and to the second and fourth base members 424, 428 by a second leg 32. Additionally, the shuttle 420 may be coupled to the third and fifth base members 426, 430 by a third leg 434 and to the fourth and sixth base members 428, 432 by a fourth leg 436. The first and second legs 30, 32 may be integrally formed with and coupled to first and second shuttle flexural pivots 40, 42, and to first and second base flexural pivots 44, 46. Similarly, the third and fourth legs 434, 436 may be integrally formed with and coupled to third and fourth shuttle flexural pivots 450, 452, and to third and fourth base flexural pivots 454, 456.

The first, third, and fifth base members 422, 426, 430 may be connected in series, and the second, fourth, and sixth base members 424, 428, 432 may be similarly connected in series. Thus, a first deformable member 460, a second deformable member 462, a third deformable member 464, and a fourth deformable member 466 are formed; each of the deformable members 460, 462, 464, 466 is coupled to one of the base flexural pivots 44, 46, 454, 456, respectively. The deformable members 460, 462, 464, 466 may be like those 60, 62 of FIG. 1, with the addition of stubs 468 to which the base flexural pivots 44, 46, 454, 456 are attached. The stubs 468 may help to avoid plastic deformation in the junctures between the deformable members 460, 462, 464, 466, and the base flexural pivots 44, 46, 454, 456. Without the stubs 468, stresses may concentrate in the junctures between the deformable members 460, 462, 464, 466 and the base flexural pivots 44, 46, 454, 456.

The use of multiple sets of legs 30, 32, 434, 436 may prevent the shuttle 420 from rotating or twisting in a non-linear path. Such rotating or twisting may cause the shuttle 420 to toggle in an unpredictable manner. Also, the additional legs 434, 436 increase the amount of force required to actuate the mechanism 420. As discussed above, the actuation force generally corresponds to the amount of force that is required to deflect the deformable mounts 460, 462, 464, 466 enough to allow the shuttle 420, legs 30, 32, 434, 436, and flexural pivots 40, 42, 44, 46, 450, 452, 454, 456 to linearly align at the toggle point.

The addition of two more deformable members 464, 466 constitutes additional potential energy that must be added to the mechanism 410 by the actuating force to toggle the shuttle 420. Thus, by adding third and fourth legs 434, 436 and third and fourth deformable mounts 464, 466, the amount of force required to move the mechanism 410 from the first stable configuration to the second stable configuration is roughly double that of the mechanism 10 of FIG. 1. As a result of the greater required actuating force, greater stability is similarly obtained. The mechanism 410 effectively has two compliant bridges, one of which extends from the first deformable mount 460 to the second deformable mount 462, and another of which extends from the third deformable mount 464 to the fourth deformable mount 466.

As shown in FIG. 8, the base members 422, 424, 426, 428, 430, 432 may take the form of enclosed anchors 422, 424, 426, 428, 430, 432. The anchors 422, 424, 426, 428, 430, 432 may be affixed to a silicon substrate in stationary fashion. FIG. 8 also depicts the third and fourth anchors 426, 428 as common elements of the first and third deformable mounts 460, 464 and the second and fourth deformable mounts 462, 466, respectively. This allows for material and size reduction, and also creates separately deflecting deformable mounts 460, 462, 464, 466 for each of the legs 30, 32, 434, 436. Attaching each of the legs 30, 32, 434, 436 to a single deformable mount 460, 462, 464, 466 simplifies the design of the mechanism 410 and the calculation of the input force 411 required to toggle the mechanism 410.

However, the mechanism 410 may also be designed without the third and fourth base members 426, 428, so that the first and third legs 30, 434 are attached to a common deformable mount extending between the first and fifth base members 422, 430, and the second and fourth legs 32, 436 are also attached to a common deformable mount (not shown) extending between the second and sixth base members 424, 432. The deformable mounts would operate in a manner similar to that described above, but with a slightly different type of deformation. Such an elongated deformable mount may beneficially allow for further material and size reduction. Another alternative embodiment may have a single central anchor (not shown) with two cantilevered beams extending from opposite sides of the central anchor. The legs 30, 32, 434, 436 may then be coupled to the ends of the cantilever beams to provide the required inward force to produce bistable operation.

Another way of controlling the stability of a bistable mechanism such as the mechanism 410 of FIG. 8 is by adjusting the orientations of the mechanism elements with respect to each other. The relative angles of the elements control the function of the mechanism. Various angles of the mechanism 410 may be varied through a wide range of values to create an infinite number of operational variations. This allows a mechanism like the mechanism 410 to be custom designed to suit individual applications and constraints.

More specifically, the mechanism 410 may be manufactured with certain angles 470, 472, 474, 480, 482, 484 in an undeformed configuration, which will be assumed to be the first stable configuration of the mechanism 410. A first base pivot angle 470 may be the angle at which the first and second base flexural pivots 44, 46 extend from the first and second deformable mounts 460, 462. A first leg angle 472 may be the angle at which the first and second legs 30, 32 extend from the first and second base flexural pivots 44, 46. A first shuttle pivot angle 474 may be the angle at which the first and second shuttle flexural pivots 40, 42 extend from the first and second legs 30, 32. A second base pivot angle 480, a second leg angle 482, and a second shuttle pivot angle 484 may be analogous to the first angles 470, 472, 474, but with reference to the third and fourth base flexural pivots 454, 456, the third and fourth legs 434, 436, and the third and fourth shuttle flexural pivots 450, 452.

If the angles 470, 472, 474, 480, 482, 484 are not selected correctly, the mechanism 410 may not be bistable. For example, the angles 470, 472, 474, 480, 482, 484 should all be positive, i.e., in the direction shown, so that the legs 30, 32, 434, 436 do not compress into a zigzag configuration with the flexural pivots 40, 42, 44, 46, 450, 452, 454, 456 when the input force 411 is applied. Similarly, the angles 470, 474, 480, 484 should preferably not be too extreme to avoid zigzagging and/or the buildup of concentrated bending stresses at the locations where the flexural pivots 40, 42, 44, 46, 450, 452, 454, 456 attach to the shuttle 420, the legs 30, 32, 434, 436, and/or the deformable mounts 460, 462, 464, 466.

The first angles 470, 472, 474 need not be the same as the second angles 480, 482, 484. If desired, different angles may be used for analogous parts of the mechanism 410 to obtain a specific input force-to-displacement curve, additional stable configurations, or the like.

FIG. 8 further demonstrates the use of the mechanism 410 as a compliant, bistable electrical switch. In this embodiment, the shuttle 420 may be positioned to close an electric circuit when actuated to the second stable configuration. More specifically, the shuttle 420 may positioned to abut an output force receiver 490, in the form of an electrical connection 490, in the second stable configuration. The electrical connection 490 may take the form of a first contact 492 and a second contact 494 separated from the first contact 492 by an air gap or an evacuated space. The shuttle 420 may be made of, coated with, or simply attached to an electrically conductive material capable of closing and completing the circuit. When the mechanism 410 is actuated, the shuttle 420 simultaneously engages the ends of the first and second electrical contacts 492, 494 to close the circuit. The circuit may then be opened again by actuating the mechanism 410 back to the first stable configuration.

Although FIGS. 1, 7, and 8 have shown embodiments in which comparatively rigid legs are connected by small length flexural pivots, other configurations may accomplish bistable operation without requiring rigid legs. For example, a single arched beam may perform the functions of the legs as well as the flexural pivots. Such a configuration will be shown and described in connection with FIG. 9.

Figure 9:
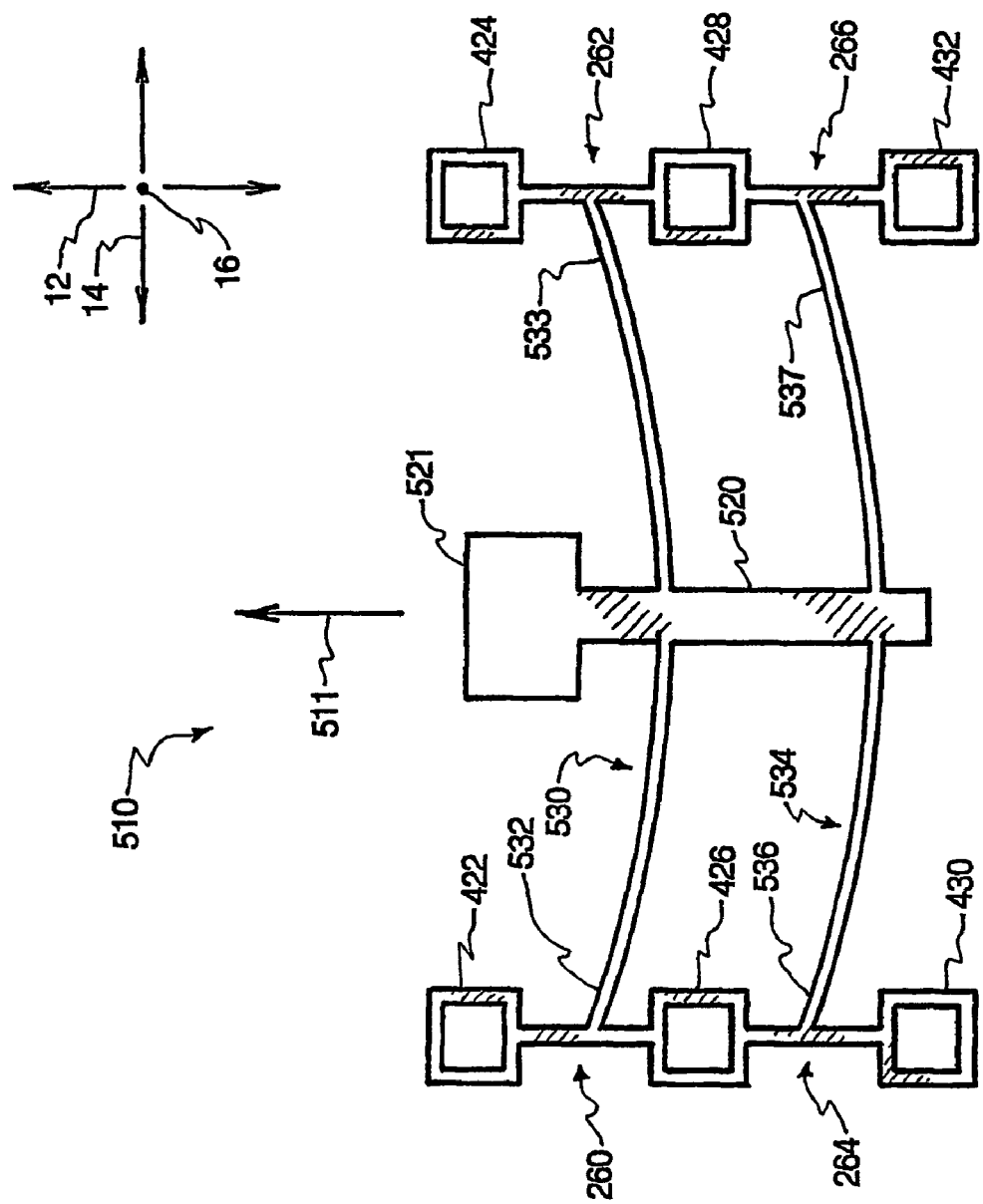
FIG. 9 is a plan view of yet another alternative embodiment of a compliant bistable mechanism according to the invention.

Referring to FIG. 9, another embodiment of a mechanism 510 according to the invention is depicted. The mechanism 510 may be bistable, and may be sized for MEMS applications. Furthermore, the mechanism 510, as shown, may be utilized as an accelerometer. The mechanism 510 may be designed to receive an input force 511, which may come from acceleration. The mechanism 510 may have a shuttle 520 configured to move in the longitudinal direction 12; the shuttle 520 may have a weight 521 affixed to or integrally formed with the shuttle 520.

The mechanism 510 may also have base members 422, 424, 426, 428, 430, 432 and deformable mounts 260, 262, 264, 266 like those of FIG. 8. However, in place of the legs and flexural pivots of FIG. 8, the mechanism 510 of FIG. 9 may have a first arched beam 530 with a first end 532 attached to the first deformable mount 260 and a second end 533 attached to the second deformable mount 262, and a second arched beam 534 with a first end 536 attached to the third deformable mount 264 and a second end 537 attached to the fourth deformable mount 266. The arched beams 530, 534 may each have a substantially uniform cross section.

The configuration depicted in FIG. 9 may be the first stable configuration, and may also be the manufacturing configuration in which no significant deformation is present. The arched beams 530, 534 may be advantageous in that their structure is very simple, and no sharp discontinuities are present to cause stress concentrations. Furthermore, they are comparatively easy to manufacture. However, the arched beams 530, 534 may make the mechanism 510 somewhat more difficult to model due to their length and the irregularity of their deformation.

As the input force 511 is applied, the arched beams 530, 534 may be compressed into an "S" shape. When the shuttle 520 has passed the toggle point, the arched beams 530, 534 may move into a second stable configuration, in which the "S" shape is maintained by the inward pressure of the deformable mounts 260, 262, 264, 266. In the embodiment of FIG. 9, the input force 511 may be applied by acceleration. More specifically, as the base members 422, 424, 426, 428, 430, 432 move in a direction opposite to that of the input force 511, inertia will act on the weight 521 to draw the shuttle 520 in the direction of the input force 511, with respect to the base members 422, 424, 426, 428, 430, 432.

The mass of the weight 521 may be carefully selected so that the mechanism 510 snaps into the second stable configuration when the acceleration on the mechanism 510 reaches a certain threshold. For example, the mechanism 510 may be used to signal a vehicle impact for subsequent diagnosis, or to trigger safety features such as airbags in real time. The mechanism 510 may simply be combined with the electrical connection 490 of FIG. 8 to close a circuit upon detection of impact. Such a bistable accelerometer may be useful in many other applications as well. The mechanism 510 may even be reconfigured to provide more than two stable configurations, so that different configurations can be obtained from different accelerations.

Like the mechanisms 10, 410 of FIGS. 1 and 8, the mechanism 510 may also be described in terms of compliant bridges. More specifically, each of the arched beams 530, 534 operates in conjunction with the shuttle 520 to form a compliant bridge.

A bistable mechanism according to the invention may be triggered in a wide variety of ways besides acceleration. With reference to MEMS applications, a bistable mechanism may be triggered by mechanical linear or rotary devices, electrostatic actuators such as comb drives, or actuators driven by thermal expansion. Such actuation will be shown and described in greater detail in connection with FIG. 10.

Figure 10:
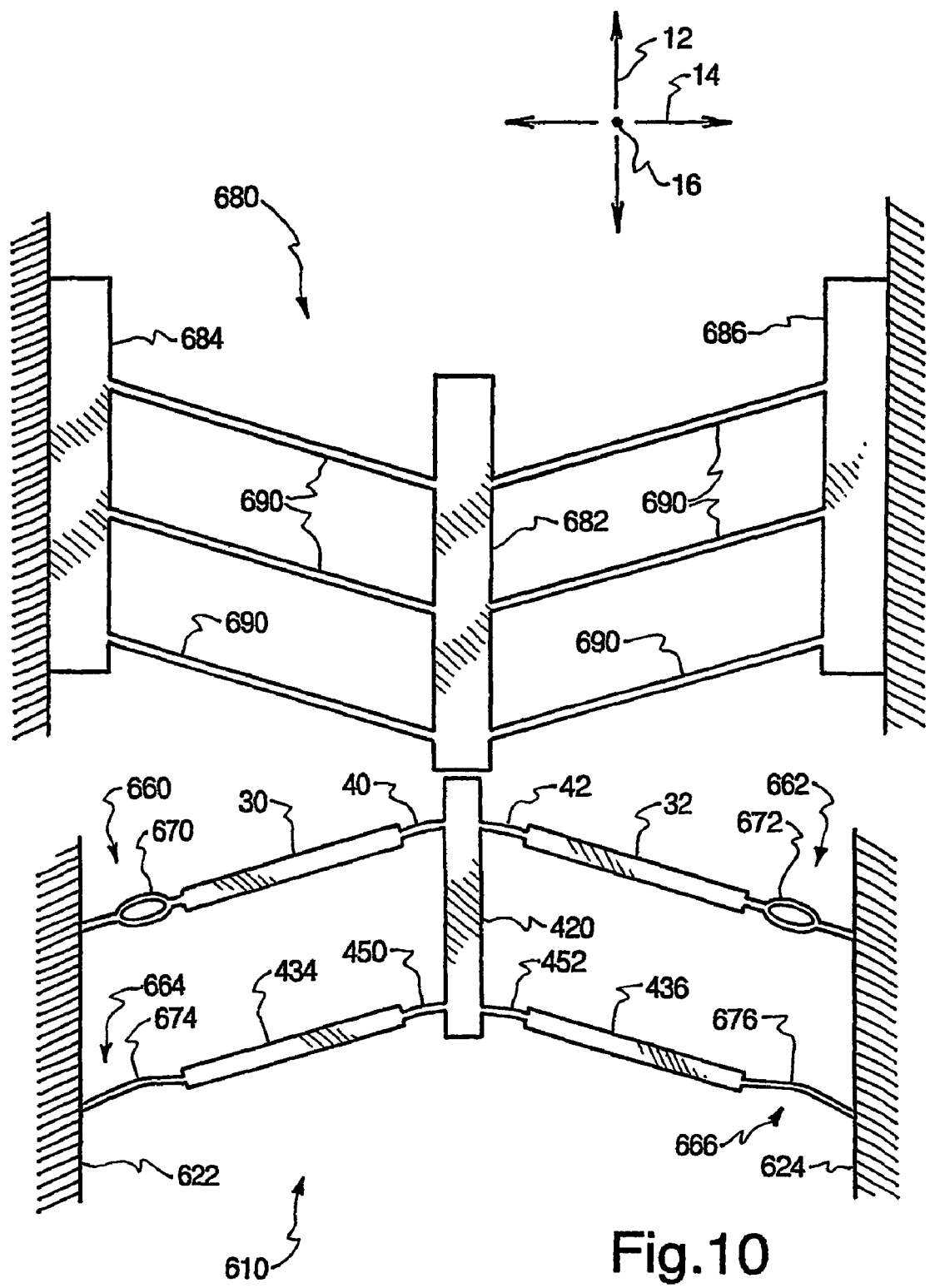
FIG. 10 is a plan view of still another alternative embodiment of a compliant bistable mechanism according to the invention.

Referring to FIG. 10, yet another alternative embodiment of a mechanism 610 with bistable MEMS application is shown. The mechanism 610 may be configured somewhat similar to the mechanism 410 of FIG. 8, with a shuttle 420 connected to first, second, third, and fourth legs 30, 32, 434, 436 by first, second, third, and fourth shuttle flexural pivots 40, 42, 450, 452, respectively. However, only two base members 622, 624 are present, and the deformable mounts 460, 462, 464, 466 of FIG. 8 have been replaced by first, second, third, and fourth deformable mounts 660, 662, 664, 666, which are provided as examples of alternative types of deformable mounts.

A "deformable mount" is not limited to the deformable mounts 60 62, 460, 462, 464, 466 depicted in FIGS. 1, 7, 8, and 9. Rather, any structure that is capable as being modeled or functioning as a spring can be used to create multiple low potential energy positions. While the embodiments of the previous figures utilize a fixed-fixed beam in each deformable mount, other types of deformable mounts may be implemented.

For example, the deformable mount may be a beam that cantilevers from a rigid surface at one end and is fixed to a small-length flexural pivot at the other end. The bending of the beam at the non-fixed end will provide the biasing force that creates the two low potential energy positions. Alternatively, the deformable mount may be a fixed-fixed arched beam or a beam that is initially deflected. In yet another variation of the bistable mechanism, the deformable mount may be a structure similar to the bistable mechanism itself, but with only one stable position; the deformable mount may simply resist any deflection from the one stable configuration to provide biasing force. One of ordinary skill in the art will recognize that there are many methods of creating a force to urge a compliant bridge into multiple low potential energy positions.

In the mechanism 610 of FIG. 10, the first deformable mount 660 has a first compressible member 670 that extends from the first base member 622 in cantilevered fashion to attach to the first leg 30. Similarly, the second deformable mount 662 has a second compressible member 672 that extends from the second base member 624 in cantilevered fashion to attach to the second leg 32. Each of the compressible members 670, 672 may take the form of a relatively thin beam with a looped portion; the looped portion may be compressed to provide the biasing force to store potential energy, thereby performing essentially the same function as the mounting beams 58, 59 of FIG. 1.

Similarly, the third and fourth deformable mounts 664, 666 may have third and fourth compressible members 674, 676, respectively. The third and fourth compressible members 674, 676 may extend from the first and second base members 622, 624 to attach to the third and fourth legs 434, 436, respectively. Each of the compressible members 674, 676 may take the form of a relatively thin beam with a bend or kink to ensure that the beam will buckle under compression. The compressible members 674, 676 may have such a shape that the buckling is elastic over the feasible range of travel of the shuttle 420.

The mechanism 610 may receive an input force from an actuator 680 disposed in close proximity to the mechanism 610. As mentioned previously, a wide variety of actuator types may be used, including micromechanical devices such as worm gears, rack and pinion assemblies and the like, electrostatic actuators such as comb drives, and thermal actuators. The exemplary actuator 680 of FIG. 10 is a thermal microactuator. The actuator 680 may have a shuttle 682 positioned close to the shuttle 420 of the mechanism 410 when the mechanism 410 is in the first stable configuration.

The shuttle 682 of the actuator 680 may be coupled to a first base member 684 and a second base member 686 by a plurality of expansion members 690, each of which is comparatively long and thin.

When electric current passes from the first base member 684 to the second base member 686, the current travels through the expansion members 690. The expansion members 690 heat up in response to the current, and expand to press inward against the shuttle 682. The shuttle 682 is thereby driven to move toward the shuttle 420 of the mechanism 610. The shuttle 682 may contact the shuttle 420, and exert pressure on the shuttle 420 until the mechanism 610 has passed the toggle point.

After the mechanism 610 passes the toggle point, the potential energy stored by the mechanism 610, and more specifically, stored by the compressible members 670, 672, 674, 676, may act to move the mechanism 610 into the second stable configuration, thereby pulling the shuttle 420 out of contact with the shuttle 682. If desired, the shuttle 420 may be moved back to the first stable configuration through the use of a second actuator (not shown), or through the application of electrical or thermal energy directly to the mechanism 610.

In the alternative, the shuttle 682, and indeed, the entire actuator 680, may be integrally formed with the shuttle 420 of the mechanism 410. Thus, the actuator 680 may be used to push the mechanism 610 into the second stable configuration, and to pull the mechanism 610 back into the first stable configuration. Once the current is disconnected, the expansion members 690 will cool, thereby retracting the shuttle 682 to pull the shuttle 420 back into its original position.

According to another embodiment, a bistable mechanism may incorporate the functionality of an actuator. For example, such a mechanism may have members that thermally expand under the application of electric current to push a shuttle into a second stable position. The shuttle may return to the first stable position after the current is disconnected. In the alternative, the shuttle may remain at the second stable position after the current is disconnected, but application of current elsewhere on the bistable mechanism may serve to return the shuttle to the first stable position.

Figure 11:
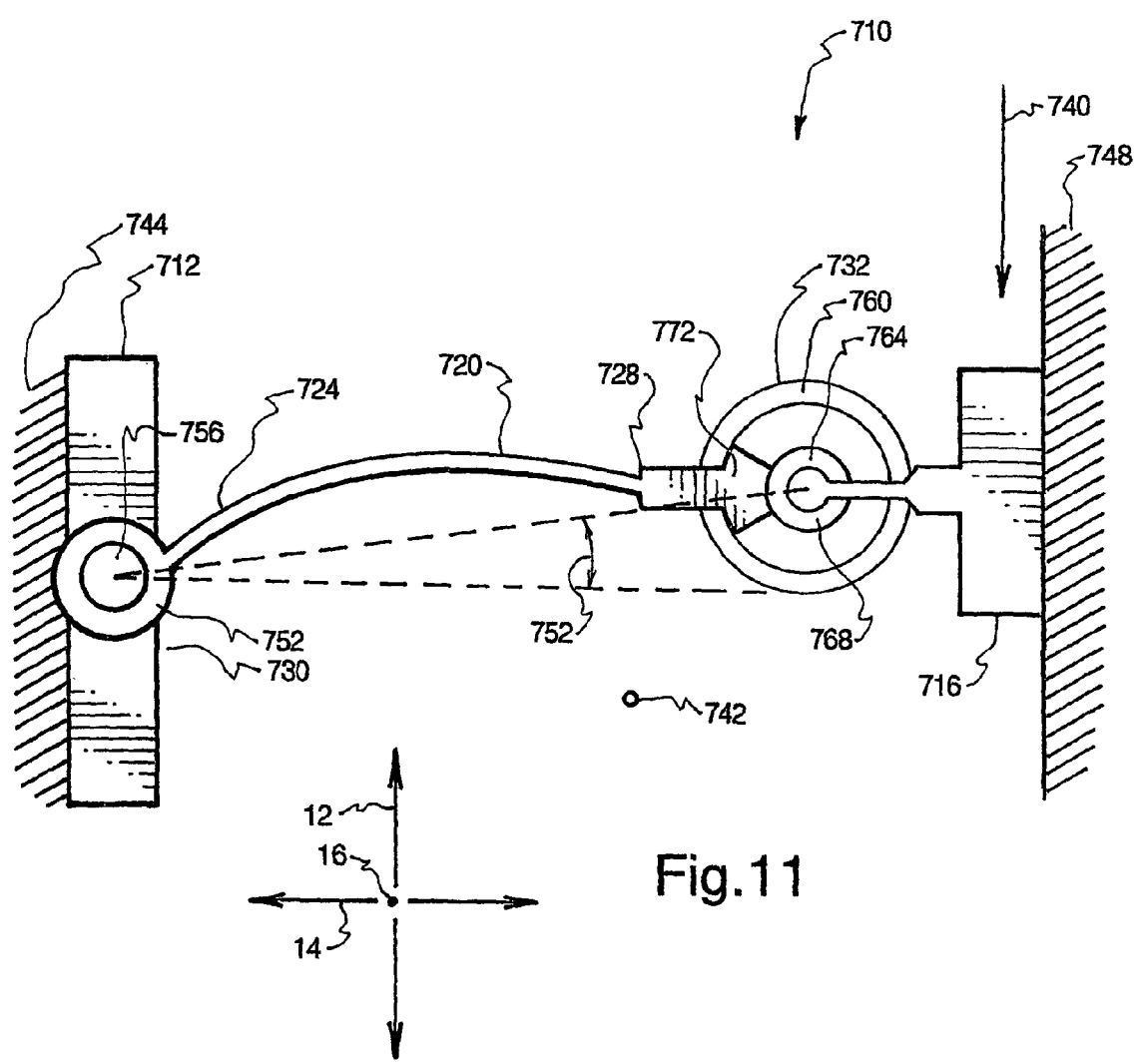
FIG. 11 is a plan view of one embodiment of a compliant pined-pinned bistable mechanism according to the invention.

FIG. 11 is an alternative embodiment of a bistable mechanism 710 that employs pin joints in MEMS application. The bistable mechanism 710 is similar to the previously discussed mechanism, in that it has a base member 712 and a shuttle 716 that are coupled together by a flexible leg 720. However, in the present embodiment the base member 712 and the base end 724 of the leg 720 as well as the shuttle end 728 of the leg 720 and the shuttle 716 are coupled together by pin joints 730, 732. The bistable mechanism 710 has a first stable configuration and a second stable configuration that are obtained by applying an actuation force 740 to the shuttle 716.

In the embodiment depicted in FIG. 11, the bistable mechanism 710 actuates when a determined actuation force 740 is placed upon the shuttle 716 in a longitudinal direction 12. Similar to other embodiments previously discussed, the bistable nature of the mechanism, 710 is in part produced by a fixed lateral 14 distance between the base member 712 and the shuttle 716. In a MEMS application, the base member 712 is typically fixed to the microchip substrate 742 or is an integral part of the substrate 742. Alternatively, the base member 712 may be fixed to another micromechanism which may or may not be fixed to the substrate 742. Generally, the base member 712 needs only to substantially maintain the lateral 14 distance between itself 712 and the shuttle 716. In FIG. 11, the shuttle 716 has a fixed lateral 14 distance from the base member 712. This fixed lateral 14 distance is produced by the shuttle being configured to slide on a surface 748 that maintains a longitudinal 12 travel. Thus, the lateral 14 distance between the base end 724 and the shuttle end 728 of the leg 720 is fixed.

This fixed lateral 14 distance allows the micromechanism 710 to function in a bistable manner. The bistability is obtained by the linear length of the leg 720 being longer than the lateral 14 distance between the base member 712 and the shuttle 716. The linear length of the leg 720 is measured as the distance from the fixed pin joint 730 to the floating pin joint, 730 add to the length from the center of the floating pin joint 732 to the shuttle's 732 contact with the sliding wall 748. In the configuration depicted in FIG. 11, the linear length of the leg 720 is equal to the lateral distance between the base member 712 and the shuttle 716 divided by the cosine of the offset angle 752 between the two pin joints 730, 732. Thus when an offset angle 752 between the pin joints 730, 732 exists, the linear length of the leg 720 will be longer than the lateral 14 distance between the base member 712 and the shuttle 716. This requires the linear length of the leg 720 to compress as the shuttle 716 is biased from the stable configuration depicted in FIG. 11 to the other stable configuration.

As the linear length of the leg 720 compresses, potential energy builds up within the leg 720. The potential energy is stored within the deformed and flexed material of the leg 720. In the embodiment of FIG. 11, the energy is stored within the curvature of the arched leg 720. The leg 720 is depicted in FIG. 11 in the first stable configuration that is at a relative zero potential energy position. The potential energy is zero because the curvature of the leg 720 is at its rest state. If the leg is bent or deflected, the potential energy will increase in the leg, causing the leg 720 to bias back to its rest configuration. The configuration of the micromechanism 710 depicted has two rest configurations, the first stable configuration and the second stable configuration.

The first and second stable configurations correspond to two low potential energy positions along the travel of the shuttle 716. The mechanism also has a toggle point that corresponds to a high potential energy position and is positioned between the two low potential energy positions. Therefore, either direction the micromechanism is biased from the toggle point will cause the leg 720 to snap to one of the two low potential energy or rest positions. Because an object will tend to stay at the lowest potential energy configuration until acted upon by a force, the mechanism 710 remains stable in both configurations. While the embodiment depicted in FIG. 11 shows an arched leg 720, any shape of leg that is capable of compressively or deflectively storing energy may be applied to the current bistable mechanism. For example, a leg that is straight at the stable or rest configurations may be employed. The leg would plastically defect or buckle as the leg approaches the toggle point. The energy created by the deflecting or buckling would force the micromechanism into one of the stable configurations.

In another embodiment, the legs may be generally "V" shaped where two straight legs intersect at an angle. Potential energy is stored in the legs as the angle between the two legs increases or decreases. This embodiment, however, does produce high stress levels at the intersection point. This may cause problems at the micro level. In yet another embodiment, different raised and lowered contours may be applied to the sliding surface to create high potential energy positions. This may be accomplished by causing the leg 720 to compress as it slides over a raised contour in the sliding surface 748. The leg 720 will tend toward a low potential energy position on either side of the high potential energy raised contour of the sliding surface 748.

To facilitate actuation between stable configurations and to maintain the curvature of the leg 710, the leg 710 is coupled to the base member 712 and the shuttle 716 through the use of pin joints. The micromechanism in FIG. 11 implements two different types of pin joints; a fixed pin joint 730 and a floating pin joint 732. Pin joints 730, 732 differ in design and manufacture from macro sized pin joints. Because of the material properties of MEMS, special designs of pin joints must be implemented.

The fixed pin joint 730 of the micromechanism 710 is made in the layering process used in MEMS, where different layer form different members of the joint. The fixed pin joint 730 has a central pin that is situated within a hole of a round or otherwise shaped socket 752. The top of the pin has an enlarged head 756 to prevent the socket 752 from slipping off of the pin. Typically, the socket 752 is manufactured on a layer above the substrate 742 of the chip to prevent stiction. Stiction is caused by Van Der Waals and electrostatic forces between the members and the substrate 742. Once stiction occurs, it is difficult or impossible to free the MEMS member. To prevent this, the mechanism members may be maintained above the substrate 742 and other members through the use of dimples. A dimple is a small section of a mechanism that extends from the bottom of the mechanism to engage the substrate 742. These dimples provide a relatively small surface area contact with the substrate 742, such that the Van Der Waals and electrostatic forces may be overcome to allow movement.

The floating pin joint 732 functions in a slightly different manner than does the fixed pin join 730. The floating pin joint 732 must not only be able to hinge two members of a mechanism 710, but it must also be capable of sliding over the substrate 742 without stiction problems. In one embodiment, the floating pin joint 732 is comprised of a ring 760 rigidly attached to a pin mount 764. The ring 760 is also rigidly attached to the shuttle 716. The pin mount 764 extends into the center of the ring 760 and a pin extends from the surface of the pin mount 764 and toward the substrate 742. The pin mates with a floating socket 768 that is also situated within the center of the ring 760. The floating socket 768 has a bridging member 772 that rigidly attaches the leg 720 to the floating socket 768. The bridging member 772 may also be configured to ride along the top of the ring 760 as the pin, pin mount 764, and ring 760 rotate relative to the floating socket 768, bridging member 772, and the leg 720. In one embodiment the ring 760, the floating socket 768, and the leg 720 are manufactured from a first layer and the pin mount 764 and the bridging member 772 are manufactured from a second layer.

Another embodiment of a floating pin joint 732 is comprised of an inner disk and an outer ring. The inner disk is situated within the center of the outer ring. The inner ring is attached to a first arm that bridges over the outer ring and the outer ring is fixed to a second arm that extends in the opposite direction of the first arm. The first arm further comprises a lip that cantilevers over the inner disk to maintain their relative engagement. The outer ring and the inner disk rotate relative to each other where the first and second arms maintain engagement and prevent slipping.

Pin joints provide advantages in certain applications over fully compliant joints. For example, pin joints allow for larger travel with smaller mechanism members, when compared to fully compliant mechanisms. Additionally, pin joints have the advantage of providing large ranges of rotational motion with minimal effect on surrounding components. In the present embodiment of the bistable mechanism, the use of pin joints allows the shape and curvature of the leg to be relatively unaffected in the first and second stable configurations. On the other hand, a compliant joint may require a significant section of the leg to bend and deflect to allow for the full range of motion needed. While the bending and deflecting of a leg in certain bistable application is acceptable, the present embodiment relies on the shape and curvature of the leg to control the potential energy storage. It is the control of this potential energy that allows the mechanism to function.

Potential energy storage is controlled by changing the curvature of the leg as it moves through the toggle point. The potential energy stored in the leg 720 increases as the leg approaches the toggle point and then correspondingly decreases as the leg 720 moves away from the toggle point. The potential energy is stored by changing the curvature of the leg away from its rest position. However if in order to facilitate motion, the curvature of the leg continues to deflect after the toggle point, potential energy may increase in the leg 720 after the toggle point If the potential energy continues to increase after the toggle point, then the mechanism may only have one low energy position and thus no longer be bistable. Thus for the present embodiment, it is advantageous to maintain the curvature of the leg through the entire range of motion. This curvature is most easily maintained through the use of pin joints.

Figure 12:
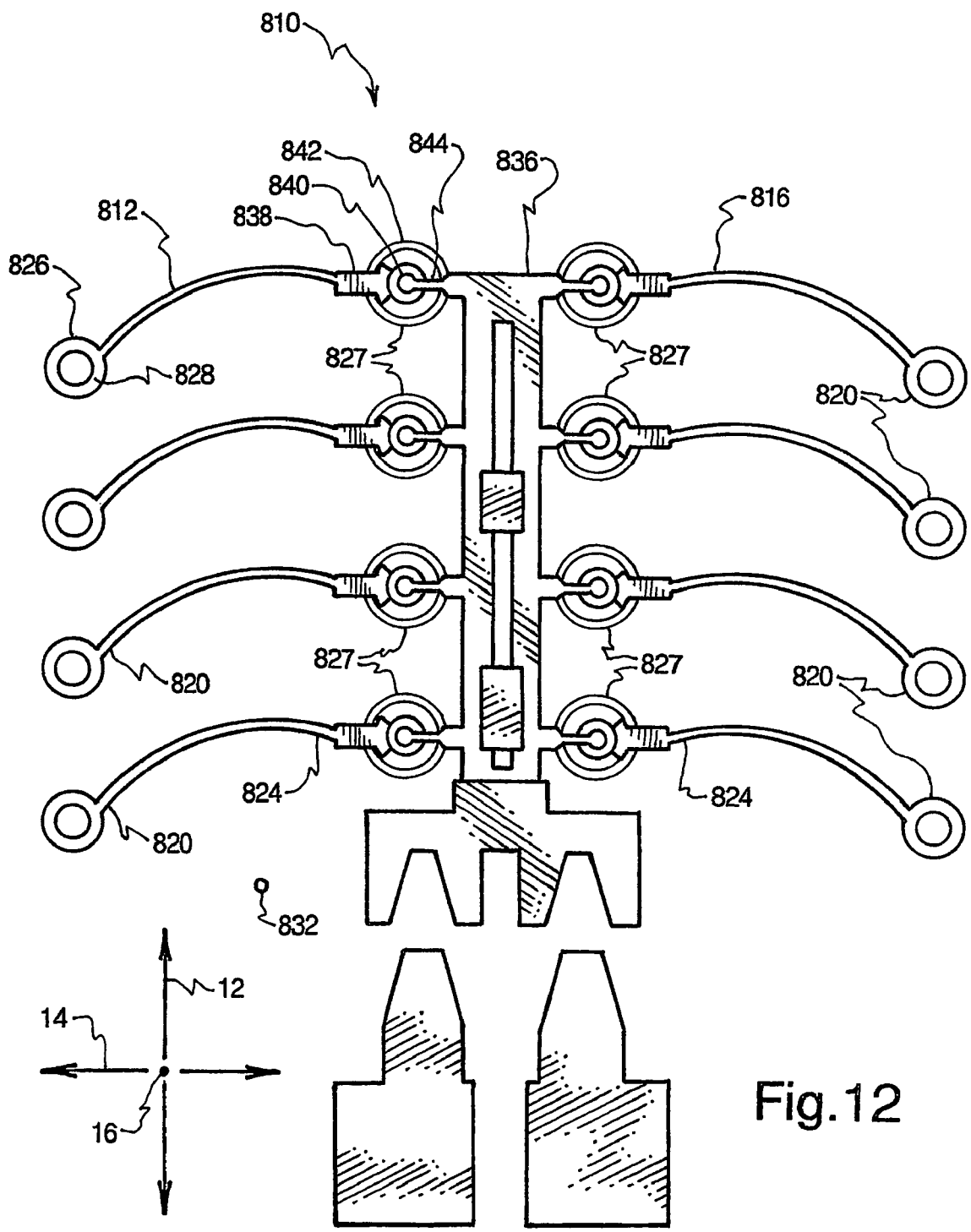
FIG. 12 is a plan view of an alternative embodiment of a non-actuated compliant pined-pinned bistable mechanism according to the invention.

FIG. 12 demonstrates an alternative configuration of a bistable mechanism 810 that uses two sets of legs that are coupled to pin joints. The mechanism 810 is depicted in the first stable configuration and functions similarly to the single leg embodiment depicted in FIG. 11. This embodiment comprises a first set of legs 812 and a second set of legs 816. Each leg in the sets 812, 816 has a base end 820 and a shuttle end 824, wherein the base ends 820 is coupled to a fixed pin joint 826 and the shuttle end 824 is coupled to a floating pin joint 827. Each base end 820 is connected to the fixed pin joint 826 by a socket 828 that is attached to the base end 820 of the legs 812, 816. The socket 828 has a hole through which a pin protrudes (not visible in FIG. 12) to rotatably mount the leg 812, 816 to the substrate 832. The socket 828 is capable of rotating about the pin.

In the embodiment depicted in FIG. 12 the base member to which the fixed pin joints 826 are attached may be a microchip substrate 832. However, the base member can take various embodiments such as a raised structure above the substrate 832 or a member of another mechanism. The base member need only maintain the relative lateral 14 distance between the base end 820 and the shuttle end 824. Other embodiments of the fixed pin joints are possible and are within the scope of this application. Additionally, the fixed pint joint may be replaced with a fully compliant mechanism, such as a small length flexural pivot. While this type of joint may not be a preferred embodiment for the given bistable mechanism 810, one of ordinary skill in the art will recognize compliant joint designs that will not interfere with the bistable nature of the mechanism 810.

While the base ends 820 of the legs 812, 816 are couple to fixed pin joints 826, the shuttle ends 824 are couple to floating pin joints 827. The floating pin joints 827 provide a rotational coupling between the legs 812, 816 while also having the ability to translate with the displacement of the shuttle 836. The shuttle end 824 is coupled to the bridging member 838 that is attached to the floating socket 840. The shuttle 836 end is conversely attached to the ring 842 and the pin mount 844. The pin extends from the surface of the pin mount 844 into a hole in the floating socket 840. This pin engagement allows the legs 812, 816 to rotate relative to the shuttle 836. The floating pin joint 827 may also translate along the surface of the substrate 832 because no element of the floating pin joint 827 is fixed to the substrate 832. Additionally, the minimal surface engagement of the floating socket 840 and the ring 842 helps to limit stiction between the floating pin joint 827 and the substrate 832. Thus, as the mechanism 810 toggles from the first stable configuration to the second stable configuration, the floating pin joints 827 can translate along the surface of the substrate 832.

Figure 13:
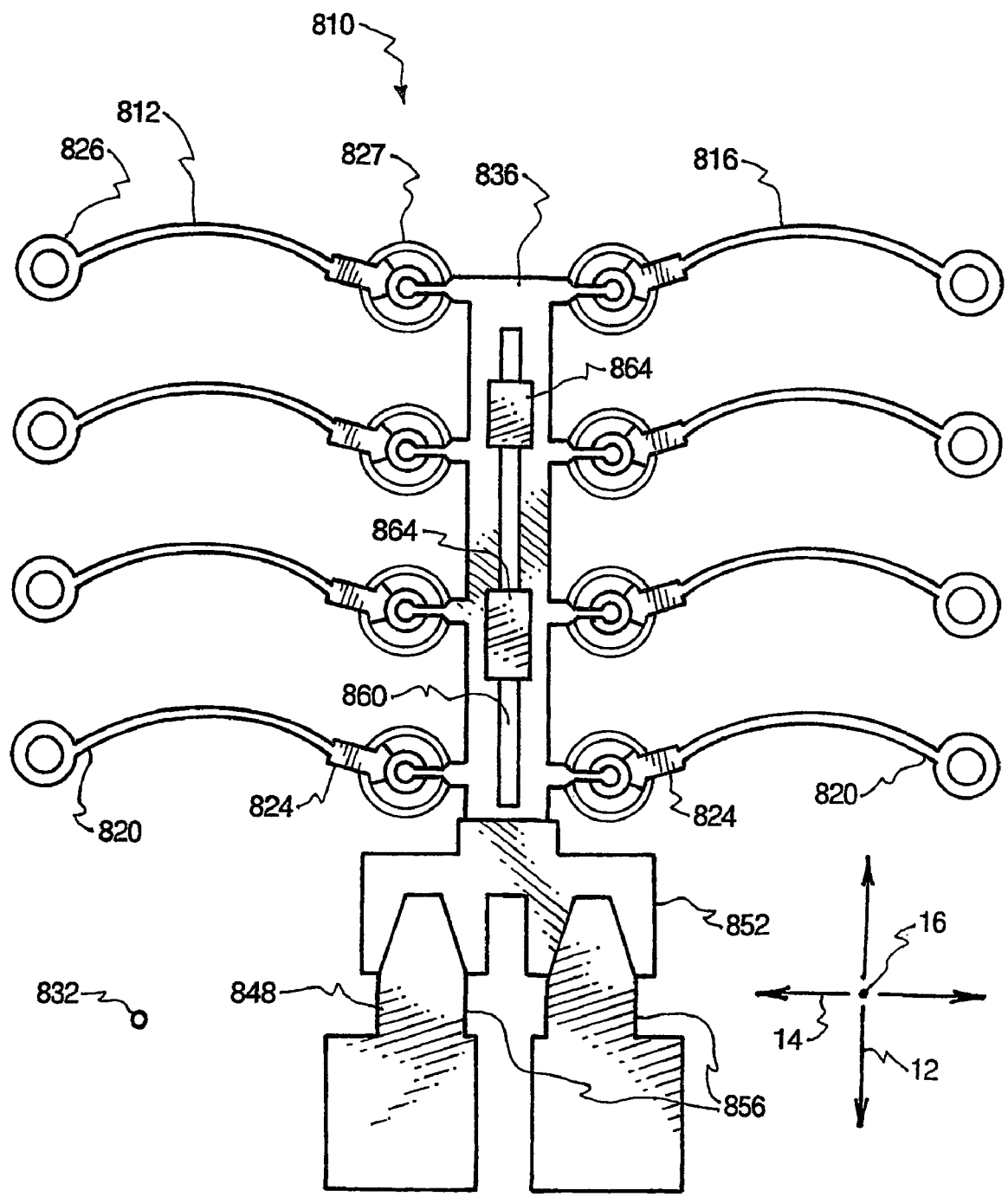
FIG. 13 is a plan view of an alternative embodiment of an actuated compliant pined-pinned bistable mechanism according to the invention.

FIG. 13 depicts the micromechanism 810 of FIG. 12 in the second stable or actuated configuration. As discussed above, this figure demonstrates that the position of the floating pin joints 827 moves with the shuttle 836 when the mechanism 810 actuates. This can be best viewed by comparing the longitudinal 12 position of the floating pin joint 827 to the longitudinal position of fixed pin joint 826. This comparison between the mechanism's 810 position in FIG. 12 and the position in FIG. 13 demonstrates that the floating pin joint 827 travels along the substrate with shuttle 836.

While FIGS. 12 and 13 depict the floating pin joints 827 as an external member of the shuttle 836, the floating pin joints 827 may be an internal structure on the body of the shuttle 836. For example, a type of fixed pin joint that sits on top of the shuttle 836 may be implemented. However, current MEMS manufacturing processes requires the connecting members to be manufactured of the same silicon or other material. Therefore in order to place a type of fixed pin joint on the shuttle 836, the fixed pin joint 826 that is attached to the substrate 832 should be raised to the same layer as the pin joint on top of the shuttle. In yet another embodiment, the pin joint attached to the shuttle end 824 of a leg from the first leg set 812 can be the same pin joint that connects a leg from the second leg set 816. Thus, the attachment location of the two pin joints would be the same position on the shuttle. In this embodiment there is only one set of pin joints down the center of the shuttle 836. The pin joint is coupled to two different legs that move relative to each other. In a variation of this embodiment, the two legs may share a common floating pin joint where no shuttle is present and the floating pin joint may be the actuation member. In yet another embodiment, the floating pin joints may be replaced with a fully compliant joint, such as a small length flexural pivot.

FIG. 13 further demonstrates that the curvature of the arched legs 812, 816 in the second stable configuration is substantially similar to the curvature of the arched legs 812, 816 in first stable configuration. As discussed above, the curvature of the arched legs 812, 816 correspond to the linear distance between the fixed pin joint 826 and the floating pin joint 827. Because the legs 812, 816 have only one fixed end (the base end 820), the rotation about the fixed pin joint 826 is in an arched or circular path. This arched path allows for two locations of the shuttle end 824 to exist that have the same linear distance between the fixed pin joint 826 and the floating pin joint 827. These two locations allow the arched legs 812, 816 to be in their non-deflected or rest states which correspond to a common curvature.

A close comparison of FIGS. 12 and 13 will reveal that there is a slight variance in the leg curvatures between the first and second configurations in the two drawings. This may be attributed to the terminals 848 that the shuttle 836 abuts. To ensure proper contact between the shuttle 836 and the terminals 848, it is preferred that the shuttle 836 continue to bias against the terminals 848 when substantially at the second stable configuration. In other words, the shuttle 836 abuts the terminals 848 before the shuttle 836 reaches the second low potential energy position. As a result, in this embodiment, the two curvatures may vary slightly.

The terminals 848, depicted in FIG. 13, are one embodiment of many possible applications for a bistable micromechanism. The present embodiment functions as an electrical switch. The micromechanism 810 in FIG. 12 demonstrates an open circuit configuration and the micromechanism in FIG. 13 demonstrates a closed circuit configuration. The shuttle 836 has a contact 852 that, when actuated, closes the circuits as shown in FIG. 13. The terminals 848 have guiding protrusions that facilitates a proper engagement and alignment with the corresponding contact 852.

The bistable mechanism may also incorporate other structures to help ensure proper engagement. For example, FIG. 13 depicts a slot 860 running in the longitudinal 12 length of the shuttle 836. Within the slot 860 is at least one guiding mount 864 that is fixed to the substrate 832. The guiding mount 864 helps to maintain a linear path of travel for the shuttle 836. Furthermore, the mechanism 810 can be assisted in traveling in a linear path by maintaining the first set of legs 812 substantially symmetric about the shuttle 836 to the second set of legs 816. This symmetry helps to keep the mechanism balanced during actuation. In the present embodiment, the guiding mounts 864 are "T" shaped to prevent the shuttle 836 from lifting from the substrate 832. One of ordinary skill in the art will recognize that there are multiple methods of maintaining a linear travel of the shuttle 836 by implementing various structures and shapes. Additionally, the bistable mechanism 810 has a wide variety of applications that would be known to one ordinarily skilled in the art, including the applications of the fully compliant bistable mechanism 410 discussed above.

Figure 14:
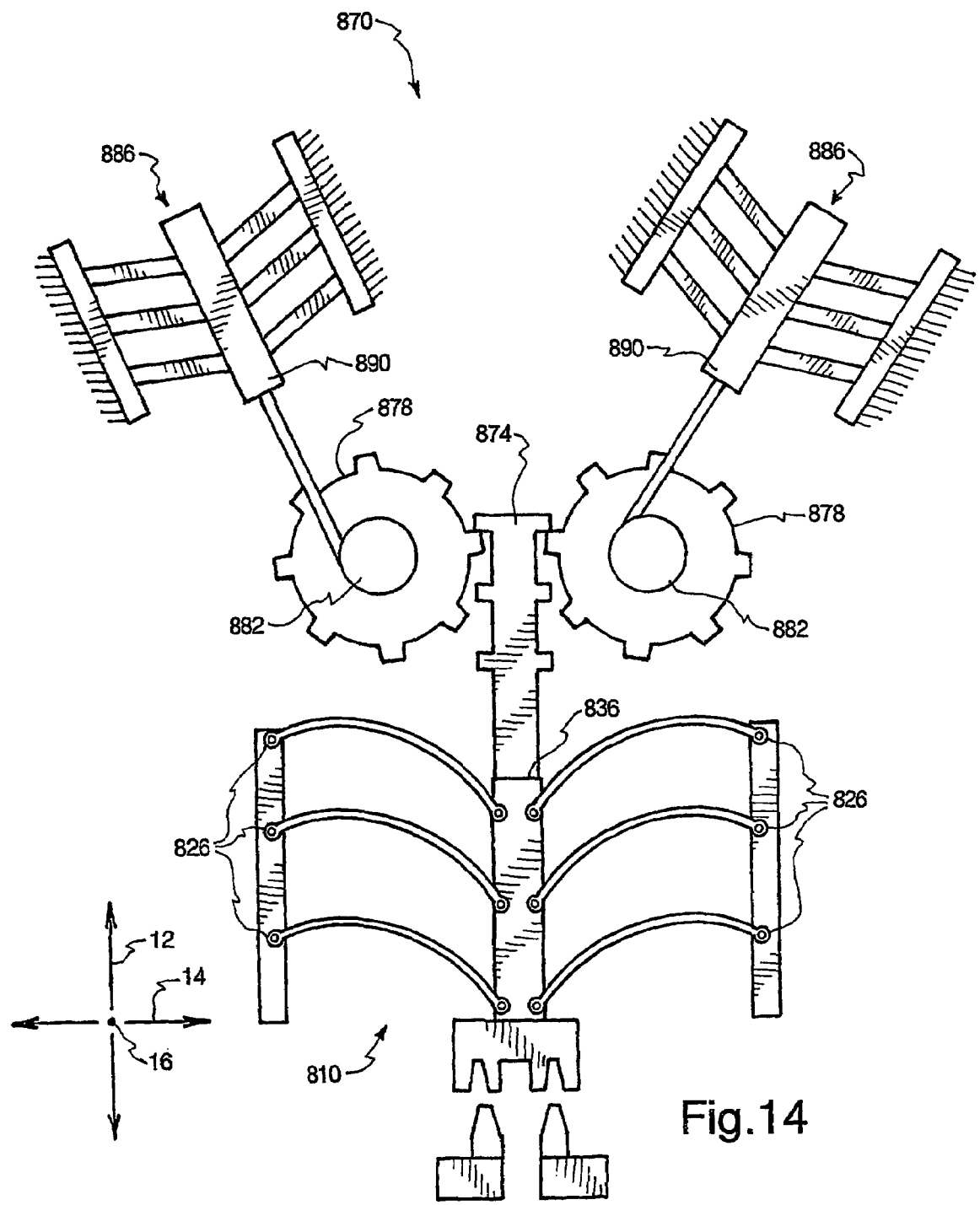
FIG. 14 is a plan view of an alternative embodiment of a non-actuated compliant pined-pinned bistable mechanism attached to a gear actuator.

FIG. 14 demonstrates a bistable micromechanism 810 coupled to an actuator system 870. The actuator system 870 depicted in FIG. 14 is capable of toggling the shuttle 836, from the first stable configuration to the second stable configuration and then back again to the first stable configuration. The system 870 has a toothed extension 874 that is attached to the shuttle 836. The toothed extension 874 is capable of driving the shuttle 836 in both directions along the longitudinal 12 axis. The toothed extension 874 is coupled to at least one gear 878, the gear having a center hub 882. The gear 878 is capable of driving the toothed extension 874, which in turn actuates the shuttle 836. In the embodiment shown in FIG. 14, the gears 878 are driven by thermal in-plane micro actuators 886. The micro actuators 886 are capable of a displacing an actuator shuttle 890 when a current runs through them. By tangentially connecting the shuttles 890 to the gear hubs 882, the actuator 886 can drive the gear 878 by driving the gear hub 882 for a half rotation and the letting the rotational momentum drive the gear 878 slightly over the top of the gear hub 882. Then when the actuator 886 retracts, it pulls the gear 878 back through the other half of the rotational cycle.

Multiple other methods for toggling the mechanism 810 exist and are within the scope of the present application. For example, a single thermal in-plane microactuator may be coupled to the shuttle 836 for a single locking operation. Additional actuators may be added to displace the shuttle 836 between stable configurations. Further, actuators may be attached to the fixed pin joints 826 to induce a rotational force on the pin joint 826 sufficient to toggle to actuator. One of ordinary skill in the art will recognize that a wide variety of embodiments exist for the bistable mechanism and are within the scope of the present application.

While the compliant bistable micromechanism provides the ability to toggle between two stable configurations, it is limited in the amount of force that can be placed upon the mechanism without toggling it to the previous configuration. In order provide a mechanism that is capable of receiving a force larger than the actuation force, a latching or locking mechanism needs to be implemented. A latch mechanism is disclosed that is configured to induce a locked configuration and an unlocked configuration by actuating a slider in a single direction. A locking member actuates a first distance in an actuation direction to induce the locked configuration and the locking member actuates a second distance induce the unlocked configuration. The second distance is a displacement that is in addition to the first distance the lock slider displaces. The latching mechanism may also have a detent slider that allows the lock slider to travel in a direction opposite the actuation direction.

Figure 15:
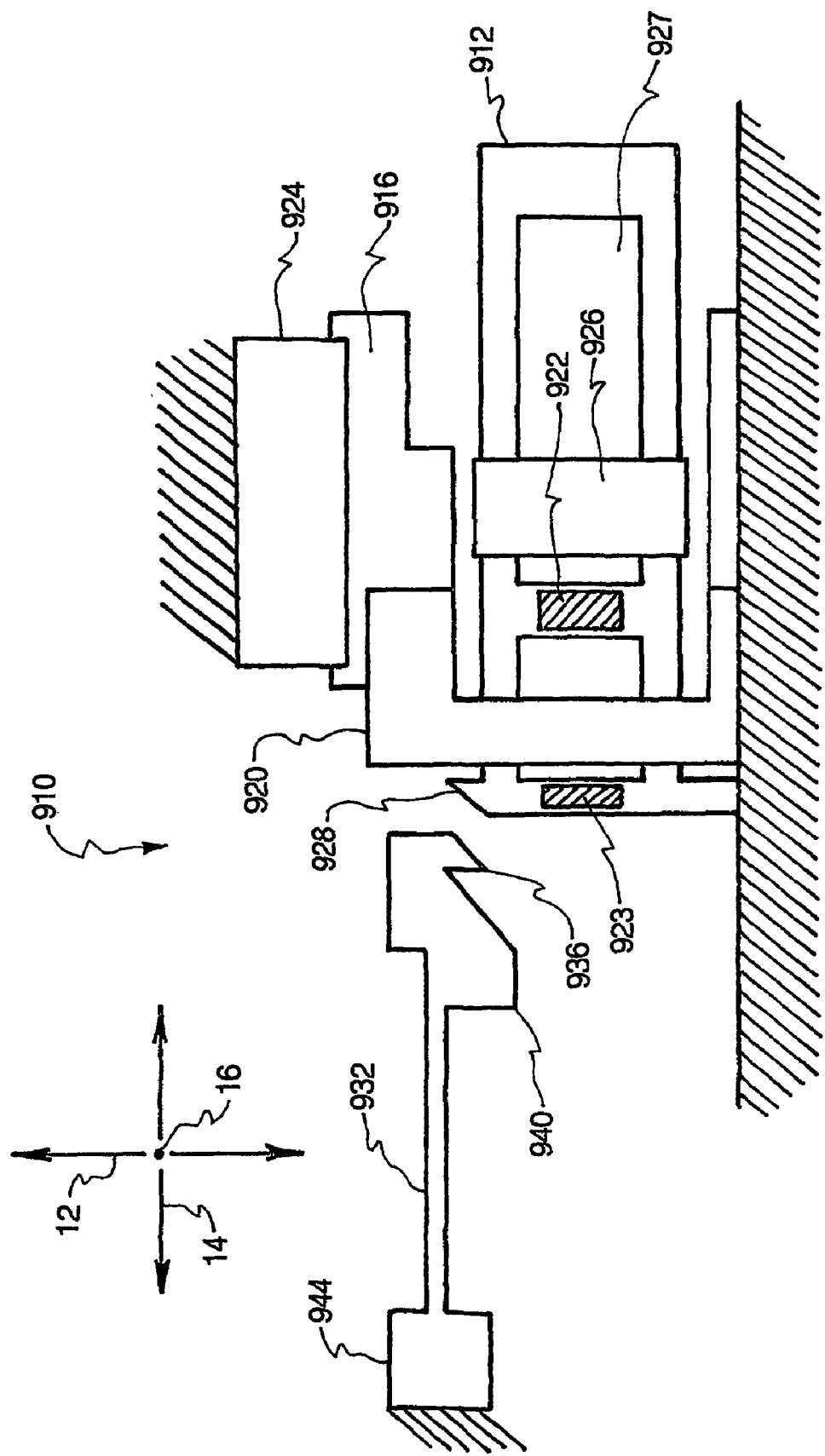
FIG. 15 is a plan of one embodiment of a latching mechanism according to the invention.

An embodiment of the latching mechanism is depicted in FIG. 15. Referring to FIG. 15, a latching mechanism 910 having a latched and an unlatched position is depicted. The latching mechanism 910 has lock slider 912 that is slidably disposed substantially within the perimeter of a detent slider 916. The lock slider 912 is maintained within the perimeter of the detent slider 916 by a raised member 920 that bridges over the lock slider 912. The height of the raised member 920 is sized to engage a first stop 922 and a second stop 923 that are located on the lock slider 912.

The detent slider 916 is slidably disposed within a base member 924. The base member 924 may be a housing or a surface which provides a structure from which the lock slider 912 and the detent slider 916 may travel in relation thereto. In a MEMS application the base member would be attached to the substrate to allow only in-plane travel. In FIG. 15, the detent slider 916 is slidably maintained on the surface by a bracket type base member 924. The lock slider 912 is similarly coupled to the surface by a guiding mount 926 fixed within a guiding slot 927. The guiding mount 926 has an overhanging head that extends over the lock slider 912 to confine the travel of the lock slider 912 to the length of the slot 927.

The lock slider 912 also has a locking mount 928 that is configured to engage a grasping member 932. In the embodiment shown in FIG. 15, the grasping member 932 is a mechanism that has a fixed end and a free end that are separated by a generally flexible arm. The grasping member 932 comprises an engagement member 936 and a disengagement member 940 that are located at the free end. The arm is also a compliant mechanism, in that it pivots about a single piece integrally formed member. Additionally, the grasping member 932 may be a compliant member because it 932 resist deflection in a spring-like manner without multiple parts or additional force absorbing members.

In the embodiment of FIG. 15 the grasping member 932 pivots about a mounting member 944 that is in a fixed location. The engagement member 936 is configured to engage the locking mount 928 in a locked configuration and the disengagement member 940 is configured to engage the locking mount 928 in an unlocked configuration. The locked configuration and the unlocked configuration can be induced by an actuation force on the lock slider 912 in a single actuation direction. The detent slider 916 is also configured to engage the engagement member 936 of the grasping member 932 to maintain the unlocked configuration. Once the detent slider 916 engages the engagement member 936, the lock slider 912 can be retracted from the grasping member 932 by a biasing force that may or may not be induced by an actuator.

Figure 16:
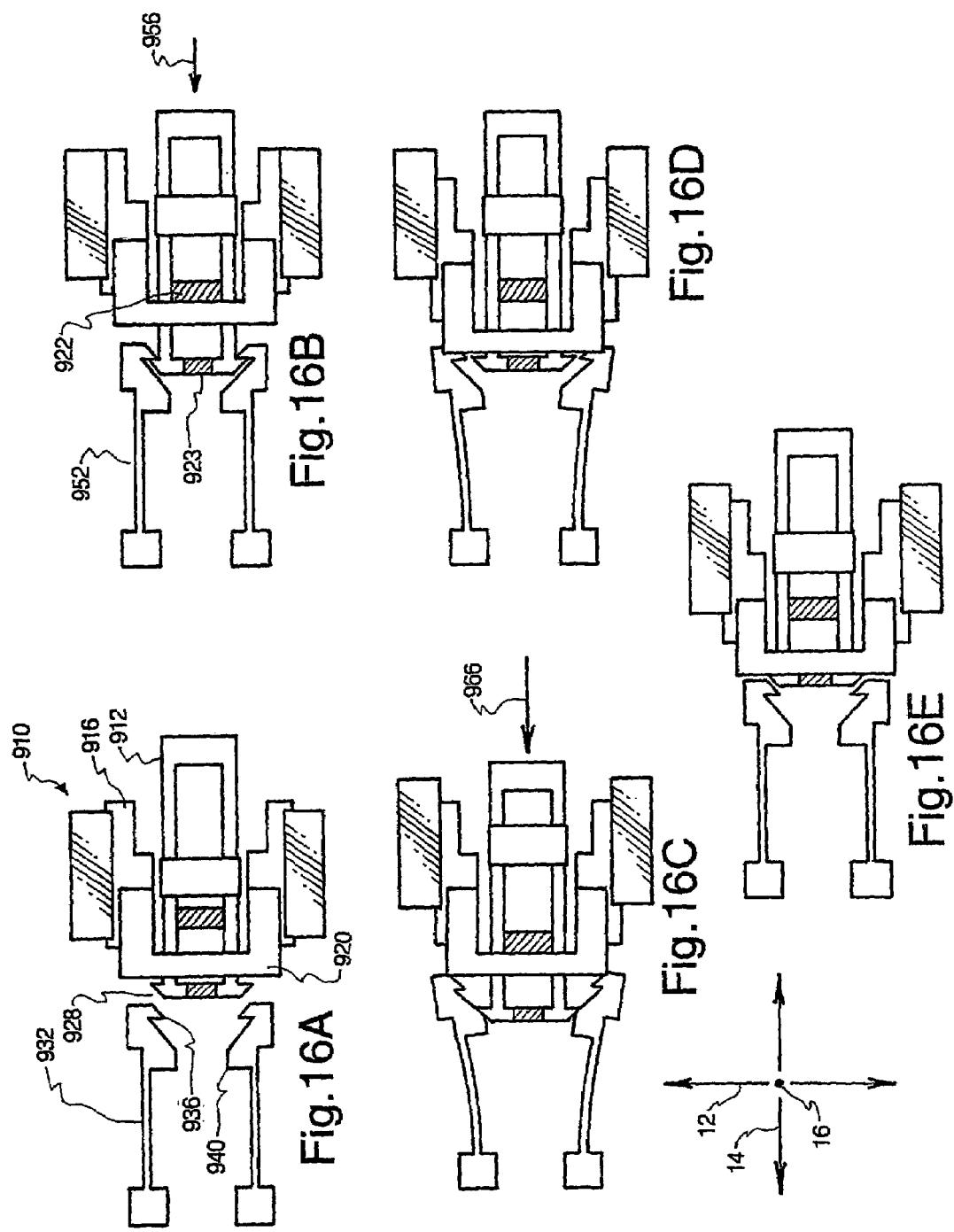
FIG. 16 is an operational plan view of an alternative embodiment of the latching mechanism according to the invention.

The relative configurations and motion of the members of the latching mechanism 910 may be best illustrated by referring to FIG. 16. FIG. 16 is an operational view of the latching mechanism represented by sub-FIGS. 16A–E. FIG. 16A is the initial configuration of a lock slider 910 that is symmetric about the lateral 14 length of the lock slider 912. This symmetry provides two grasping members 932 that are capable of engaging the locking mount 928. In this configuration, the lock slider 912 and the associated locking mount 928 are not engaging the grasping members 932. This is the initial unlocked configuration.

The lock slider 912 engages the grasping members 932 in FIG. 16B upon receiving a locking force in the lateral 14 direction. The locking force is sufficient to displace the lock slider 912 a first distance. The locking force need only be of a magnitude capable of sliding the lock slider a first distance and deflecting the grasping members 932 is a locking deflection which induces a locked configuration. However, the actuation distance of the locking force is preferably the minimal length required to engage the locking mount 928 to the grasping members 932. In the embodiment depicted in FIG. 16, the first distance is preferably identified as the distance required to engage the locking mount 928 to the grasping members 932 or of a distance equal to the distance between the first stop 922 and the raised member 920.

In this locked configuration, as depicted in FIG. 16B, the latching mechanism 910 is substantially more stable that a typical bistable mechanism. Because the locking mount 928 has an interference engagement with the engagement members 936, the engagement is capable of sustaining a force opposite the actuation direction that is larger than the actuation force. This is in contrast to a typical bistable mechanism where the force required to actuate the mechanism back to its first stable configuration is equal to or less than the force that originally actuated the mechanism to the second stable configuration. Thus, the amount of force that can be applied to the lock slider 912 in a direction opposite the actuation direction is only limited by the structural and engagement properties of the grasping member 932 and the locking mount 928.

In a preferred embodiment, the engagement of the grasping members 932 and the locking mount 928 is accomplished by two members locking in the in the same plane. If one member slips above or below that plane, then the lock slider 912 and the grasping member 932 will disengage. The disengagement force would thus be the force required to induce an out-of-plane 16 slipping between the two members. However, various geometric features can be implemented to the latching mechanism 910 to prevent slipping. For example, an overhanging lip may be added to prevent slipping or the engagement member 928 may have a groove that prohibits out of plane slipping.

Alternatively, the force that the lock slider 912 is capable of sustaining may be limited by the weakest failure mode of the grasping member 932. In the embodiment depicted in FIG. 16, the weakest failure mode may be the tensile strength of the thin flexible arms 952. If a force is placed upon the lock slider 912 that induces a tensile force in the thin flexible arms greater than the maximum tensile load, then the locking mount 928 will be released from the grasping member 932, and will return to the original position of FIG. 16A. Additionally, stress concentrations in the engagement members 936 or in the intersection of the thin flexible arms 952 with the mounting members 944 may cause the members to fail and allow the lock slider to return to the original position of FIG. 16A. Such stress concentrations may be caused by the geometry of the grasping members 932 or the locking mount 928. Further, fatigue stresses in the members may also create failure location in the latching mechanism 910.

While, the latching mechanism 910 is capable of maintaining a large force in a direction opposite the actuation direction, the latching mechanism is capable disengaging the grasping member 932 by a force generally equal to the actuation force. To disengage the lock slider 912 from the grasping members 932, a force is place upon lock slider 912 in the lateral 14 actuation direction that displaces the lock slider 912 a second distance. As depicted in FIG. 16C, the second distance is a distance capable displacing the lock slider 912 a distance sufficient to engage the disengagement members 940 of grasping members 932. The detent slider 916 is configured to react to the second displacement of the lock slider 912, wherein the reaction displaces the detent 916 slider from the position depicted in FIGS. 16A and 16B to the position depicted in FIG. 16C.

In the embodiment shown, the detent slider 916 is displaced the second distance when the first stop 922 abuts the raised member 920. A discussed previously, the lock slider 912 is configured to slide within the detent slider 916. The raised member 920 is the section of the detent slider 916 connecting the two sides of the detent slider 916 and bridging over the lock slider 912. The raised member 920 is situated above the lock slider 912 at a height sufficient allow the lock slider 912 to slide relative to the detent slider 916. However, the raised member 920 is also of a height sufficient to abut the stops 922, 923 in response to a determined movement of the lock slider. In FIG. 16C, the first stop 922 abuts the raised member 920 when the lock slider 912 displaces the second distance. The second displacement distance drives the detent slider 916 to engage the engagement members 936 of the grasping members 932. A shown in FIG. 16C, the detent slider 916 lodges between the two grasping members 932, such that when the lock slider 912 retracts from the disengagement members 940 the grasping members 932 are maintained in an unlocked configuration by the detent slider 916.

The locked and unlocked configurations, in the embodiment shown, relate to the relative position of the grasping members 932 to the lock slider 912. The locked configuration, FIG. 16B, occurs when the locking mount 928 engages the engagement mounts 936 of the grasping members 932. In order to engage the engagement mounts 936 the locking mount 928 must first spread apart the grasping members 932 that are spaced more narrowly than the width of the locking mount 928. As the locking mount 928 first abuts the grasping member 932, the angled edged of the locking mount 928 spread apart grasping members 932 until the flat edge of the locking mount 928 reaches the flat edge of the engaging mounts 936, as depicted in FIG. 16B. This flexing and spreading of the grasping members 932 to engage the locking mount 928 and the resulting engagement is referred to herein as the locking deflection. The locking deflection of the grasping members 932 allows the lock slider 912 and the grasping members 932 to create a locked configuration.

The unlocked configuration, FIG. 16C, occurs as the lock slider is displaced in the actuation direction and the locking mount 928 abuts the disengagement members 940 of the grasping members 932. In the embodiment shown, the disengagement member 940 is an angled structure where the angle is substantially parallel to the angled edges of the locking mount, as shown. The disengagement members 940 of the two grasping members 932 are spaced at a distance narrower than the width of the locking mount 928. The difference in width between the locking mount 928 and the grasping members 932 causes the angled edges of the locking mount 928 to spread apart the disengagement members 940 and resultantly spread apart the grasping members 932 in an unlocking deflection. This operates in a ramping manner, such that as the disengagement member 940 is driven further into the angled edge or ramp, the grasping members 932 move further away from their rest or locked configuration.

In the embodiment shown, the spacing apart of the two grasping members 932 in the unlocking deflection is larger than the spacing of the two grasping members 932 in the locking deflection. This difference in spacing between the grasping members 932 in the locking deflection and grasping members 932 in the unlocking deflection is of sufficient spacing to allow the locking mount 928 to retract in a direction opposite the actuation direction without re-engaging the locking mount 928. As depicted in FIG. 16D, the grasping members 932 are maintained in the unlocking deflection by the detent slider 916 at a spacing larger than the width of the locking mount 928.

With the spacing of the grasping members 932 maintained by the detent slider 916, the lock slider 912 can retract a distance such that when the detent slider 916 disengages the engagement members 936, the locking mount will not re-engage the engagement member 936. To disengage the detent slider 916 from the grasping members 936, the lock slider is equipped with a second stop 923. The stop 923 is raised above the surface of the lock slider 912 at a height sufficient to abut the raised member 920 of the detent slider 916. Thus, as the lock slider 912 retracts from the grasping members 932, the second stop 923 abuts the raised member 920 and retracts the detents slider 916 from the engagement members 936 of the grasping members 932. Once the detent slider 916 retracts, the grasping member returns to its initial unengaged configuration, FIG. 16E.

One advantage of the present latching mechanism is that the mechanism may lock and unlock by a single directional force. FIG. 16 demonstrates this single directional force by the lateral 14 force arrows depicted in sub-figure 16B and 16C. The first force 956 induces a translation of the lock slider 912 the first distance, as shown in FIG. 16B. The force need only be of sufficient magnitude and distance to induce an unlocking deflection in the grasping member 932 to engage the locking mount 928 in the locked configuration. This same force creating source that induced the locked configuration may be used to induce the unlocked configuration. This second force 966, in the embodiment shown, may also act upon the lock slider 912 in the same direction as the first force 956. The second force induces a displacement in the lock slider 912 to translate a second distance, where the second distances is in addition to or longer than the first distance from the initial configuration in FIG. 16A.

The difference in displacement length of the lock slider 912 between these two forces 956, 960 is demonstrated by the relative size of the arrows in FIGS. 16B and C. The first force 956 arrow is shorter than the second force 960 arrow. This indicates that second displacement is further from an initial reference point than is the first displacement. Thus, the lock slider 912 is further from its initial configuration, FIG. 16A, at the second displacement, FIG. 16C, than it is at the first displacement, FIG. 16B. While the net distance of the second displacement is larger than the first displacement, the actual distance travel by the lock slider to induce the unlocked configuration need not be longer than the actual distance traveled to induce the locked configuration. The distance the lock slider 912 travels from the initial configuration to the locked configuration may be longer or shorter than the distance the lock slider 912 must travel from the locked configuration to the unlocked configuration, depending upon embodiment.

While a single force actuation is capable of inducing a locked and unlocked configuration in the mechanism, the force in a direction opposite the actuation direction is required to retract the lock slider 912 which in turn retracts the detent slider 916. Various embodiments may be applied to the present mechanism to provide this retracting force without the necessity of additional actuators. In one embodiment, the latching mechanism is microelectromechanical mechanism that is located on a microchip. In this embodiment, limiting actuators is important to size and power restrictions.

Figure 17:
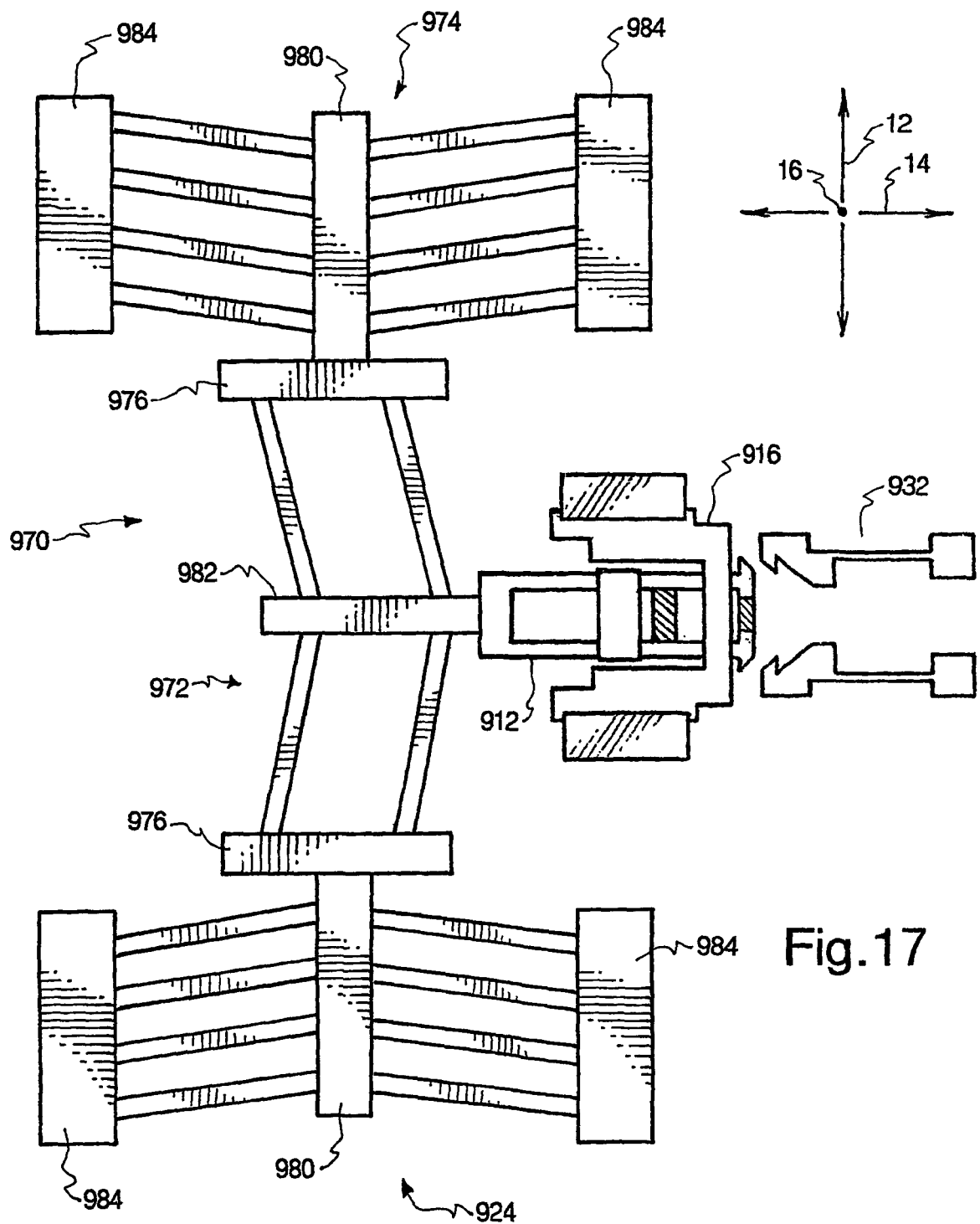
FIG. 17 is an operational plan view of an alternative embodiment of the latching mechanism attached to an amplified thermal in-plane microactuator.

In a MEMS application, the first and second forces 956, 960 may be induced by single directional actuator. One such actuator is the amplified thermal in-plane microactuator 970 as depicted in FIG. 17. The actuator, as shown, comprises three non-amplified thermal in-plane microactuators 972, 974 that are connected in an amplified configuration. The amplified configuration is created by coupling the base members 976 of a central actuator 974 to the shuttles 980 of two side actuators 974. When the shuttles of the side actuators 974 actuate, they amplify the displacement of a central shuttle 982 that is coupled to the lock slider 912.

The thermal in-place microactuators 972, 974 actuate their shuttles 980, 982 when a current is passes through opposing base members 976, 984. The shuttles 980, 982 will actuate a distance that corresponds to the amount to current within the each actuator. Thus, simultaneously applying a current through all three actuators 972, 974 will cause the central shuttle 982 of the amplified actuator 970 to displace a first distance. If that current is increased, then the actuation distance will correspondingly increase.

Once the current is removed, the central shuttle 982 will return back to its unactuated position. The actuator 970 requires no additional force or energy to return to the initial configuration. Potential energy is generated when the shuttle 982 is displaced. The potential energy is then released, driving back the shuttle with a determined force to the initial configurations. The force is sufficient to retract any member, such as a lock slider 912, that is coupled to the central shuttle when the current is removed.

When the amplified thermal in-plane microactuator 970 is attached to the lock slider 912, a current of a determined magnitude within the actuator will displace the lock slider 912 a first distance until it engages the grasping member 932. The current source may then be removed from the amplified actuator 970. Because the lock slider 912 is locked to the engagement members 940 of the grasping members 932, the microactuator cannot return to the unactuated position. Thus, the potential energy generated by actuating the central shuttle 982 is stored by the lock slider 912 and grasping member 932 engagement.

A second current, that is large than the first current, may next be applied to the microactuator to actuate the shuttle a second distance that is further from the unactuated distance than is the first distance. Because the central shuttle 982 is already locked at the first distance, energy is only need to actuate the central shuttle 982 the difference between the first distance and the second distance. This second distance drives the lock slider 912 into the unlocked configuration which in turn drives the detent slider 916 into an unlocked engagement with the grasping member 932. Once the current grasping members 932 are in their unlocking deflection the current may be removed. Because the lock slider 912 is no longer engaged with the engagement members 936, the potential energy in the amplified actuator 970 retracts the central shuttle 982 and the attached lock slider 912 to the initial position. While retracting, the second stop 923 of the lock slider 912 abuts the raised member 920 of the detent slider 916 to retract the detent slider 916 from the grasping member 932.

Other methods of creating a reactive force on the latching mechanism 910, without the necessity of additional actuation members, are possible. For example, the lock slider 912 may be attached to a spring member that elongates as the lock slider travels the first and second distances. Once the actuation force is removed, the spring will retract the lock slider 912. Further, a spring member may be place in a configuration where the spring compresses as the lock slider 912 travels the first and second distances. Once the actuation force is removed, the spring member will bias the lock slider 912 to its initial position. The spring member may be any number of members known to one of ordinary skill in the art. For example, a simple spring or an elastic member could be used to create the retracting force. In MEMS applications, a system of small length flexural pivots could be used to create a spring type force on the lock slider 912. These spring member applications would allow the actuation member that locks and unlocks the mechanism to not be rigidly attached.

While it is preferably in one embodiment for only a single directional actuator to be used in the present latching mechanism, multiple actuators or force creating devices can be used to induce the locked and unlocked configuration as well as retracting the lock slider 912 and the detent slider 916. For example, in a macro embodiment an operator's hand could be used to lock, unlock, and retract the mechanism. In another embodiment, the reaction force of an impulse force acting upon the lock slider 912 or other members could retract the lock slider 912 and the detent slider 916. In yet another embodiment, the lock slider 912 may be mounted in a manner so that gravity retracts the lock slider 912 and the detent slider 916. In this configuration, the detent slider 916 would be configured such that it would not disengage the grasping member 932 because of gravity, but would disengage when abutted by the lock slider 912. This may be accomplished by lower mass of detent slider 916 when compared to the lock slider 912 or by a high coefficient of friction material located on the engagement members 936.

Figure 18:
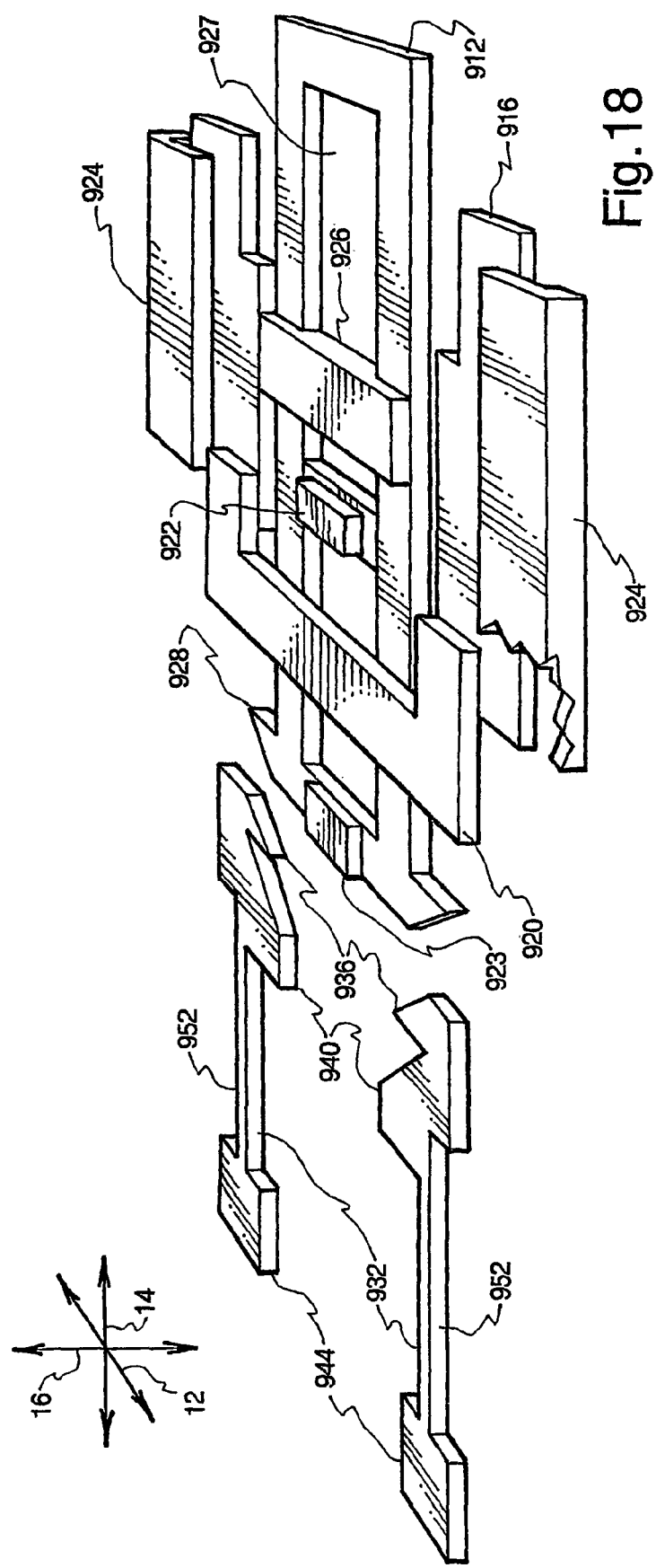
FIG. 18 is an isometric view of an alternative embodiment of the latching mechanism according to the invention.

FIG. 18 demonstrates and isometric view of a preferred embodiment of the latching mechanism, wherein the mechanism has a lock slider 912, a detent slider 916, and at lest one grasping member 932. However, a significant number of variations of this latching mechanism can be created by modifying various elements of the mechanism. Many of these embodiments can be captured in a discussion of the method of latching a mechanism disclosed herein. First, a lock slider 912 or similar member is displaced a first distance in an actuation direction to engage a grasping member 932. The lock slider 912 and grasping members 932 may be of any structure or configuration that allows the two members to engage. This engagement may be within a plane defined by the longitudinal 12 and lateral 14 datum lines or may be in an out-of-plane 16 direction, perpendicular to the plane.

Next the lock slider is displaced a second distance in the same direction as the first displacement to create an unlocked configuration. Similar to the locked configuration, the unlocked configuration can occur in any manner that allows the lock slider 912 to disengage from the grasping member 932, within the longitudinal 12 and lateral 14 datum line plane or out of this plane 16. Then, the detent slider 916 is displaced a third distance in the same direction as the first and second directions to maintain the unlocked configuration of grasping member 932. This may be accomplished in many ways beyond simply wedging the two grasping members apart as depicted in FIG. 16C. Additionally, the step of displacing the lock slider 912 the second distance and the step of displacing the detent slider 916 the third distance may occur simultaneously. Further, the second distance may equal the third distance in some embodiments. Having these two distances equal may be desired in applications where the distance an actuator is allowed to travel is limited.

Finally, the lock slider 912 is displaced a fourth distance that is in the opposite direction of the first, second, and third directions. This displacement of a fourth distance is sufficient to disengage the grasping member 932. Additional steps may also be present in the disclosed process, such as, the detent slider 916 may be displaced or retracted in a direction opposite the first, second, and third directions. When the detent slider is retracted, it disengages the grasping member 932 in the unlocked configuration. This process may also occur simultaneously with the step of displacing the lock slider 912 the fourth distance. The process described above is not intended to be limited by the structure described above. The process need only provide for a method of locking and unlocking a latching mechanism by applying a force in a single direction.

Other embodiments, beyond what are depicted in the figures may be used in the latching mechanism. Some embodiments may not include all members as depicted in the figures. For example, the latching mechanism may only include a lock slider 912 and a grasping member 932. This mechanism would operate in a similar manner as the embodiment depicted in FIG. 18, except that detent slider 916 would not be required to maintain the grasping members 932 in an unlocked configuration. The grasping members 932 need only be maintained in an unlocked configuration for an amount of time sufficient to allow the lock slider 912 to retract from the grasping members 932.

To maintain the grasping members 932 in an unlocked configuration for a duration of time, a dampening member could be attached to the grasping members 932 to prevent them from returning to the locked configuration when the lock slider 912 is removed. The grasping member 932 would be induced into the unlocked configuration, as discussed above. However, once the lock slider 912 induces the unlocking deflection in the grasping members, in need only be displaced in the direction opposite the actuation direction before the dampened grasping members 932 return to the locked configuration. This dampening may be obtained by attaching fasteners to the grasping member 932 than dampening their motion from the unlocking deflection to the locking deflection in the longitudinal direction 12. Alternatively, the material of which the grasping members 932 are comprised may have dampening properties that causes the grasping members 932 to return slowly to the locking deflection. In some embodiments the latching mechanism may be made of plastics, metallic, or silicon material. In yet another embodiment, the grasping members 932 may be submerged in a fluid that dampens the movement of the grasping members 932. Various structural members could be added to the latching mechanism to assist in the process.

In other variations of the latching mechanism, the unlocking deflection need not be induced by the lock slider 912 abutting the disengagement members 940 of the grasping members 932. The present mechanism encompasses any method of opening grasping members 932 or disengaging the lock slider 912 that may be accomplished when moving the lock slider 912 or the detent slider 916 relative to the grasping members 932. For example, the detent slider 916 may have a deflecting member, such as a protruding arm, that engages a disengagement member on the grasping member 932 to cause an unlocking deflection. In another example, the disengagement members 932 may have a deflecting member that engages a disengagement member on the lock slider 912 of the detent slider 916. This could be in the form of a pair of rigid arms extending from the grasping member 932 that engage a ramped section to the detent slider 916 unlock the grasping member 932.

In the embodiment depicted in FIG. 18, the grasping members 932 are induced into the unlocking deflection by the angled edge of the locking mount 928. However, various other method of inducing the unlocking deflection can be accomplished by varying the structure of the lock slider 912. Various extending structures and ramped member can be employed to induce the unlocking deflection in grasping members 932. One ordinarily skilled in the art will recognize that there are many variations to the invention that may be accomplished without departing from the latching mechanism disclosed.

In yet another variation of the mechanism, the locking mount 928 may deflect to engage rigid grasping members 932. The locking mount 928 and the grasping members 932 need only deflect relative to each other, such that they interlock one with the other. The locking mount 928 could simply be a part of a flexible member that is deflected into a locking deflection with the grasping members 932. The locking mount 928 could have a dampening member attached that allows the locking mount 928 to remain in the unlocked configuration for a time sufficient to retract the lock slider 912 from the grasping member 932. Alternatively, the detent slider 916 may engage the locking mount 928 to maintain the unlocked configuration until the lock slider 912 is retracted.

In another embodiment, the locking mount 928 need not be on the front section of the lock slider 912. The locking mount may be a number of notches or channels in the side of the lock slider. Additionally, the grasping members 932 may have a notch on top of the lock slider 912 for an out-of-plane 16 engagement with the lock slider 912. Multiple variations of locking mount 928 or any section of the lock slider 912 to the grasping members 932 are possible and are within the scope of this application. In yet another variation of the latching mechanism, the position of the lock slider 912 relative to the detent slider 916 may be reversed. The detent slider 916 may be slidably situated within the locking mount 912. The mechanism would simply operate similar to the embodiment of FIG. 16.

The structure and the operation of the grasping members 932 could be easily varied to create alternative embodiments of the present mechanism. In the embodiment shown in FIG. 18, the grasping mechanism 932 is a complaint mechanism where the thin flexible arm 952 provides a flexible joint. However, other non-complaint structure could be employed as well as alternative embodiments of the compliant grasping member 932. For example, the grasping member 932 could be a spring loaded pivoting mechanism with two engagement members 936. Alternatively, the engagement members 936 could be configured to face away from each other to engage to the locking mount 928.

Besides the variations of the locking and unlocking structure of the latching mechanism, the raised member 920 and the stops 922, 923 may also be varied. For example, the stops may be mounted on the sides of the lock slider 912 in such manner that it engages a member of the detent slider 916 to drive the slider in the operation of the mechanism. In yet another variation, an actuator coupled to the mechanism may selectively abut different members during different displacement, thus eliminating the stops. For example, an actuator could be configured to drive the lock slider 912 a first distance, but then actuate the lock slider 912 and the detent slider 916 together the second distance. This could be accomplished by adding a structure to the detent slider 916 that abuts the actuator during the displacement of the second distance. Alternatively, the actuator could only drive the detent slider the second distance and a stop on the detent slider 916 could drive the lock slider 912 the first distance. Various shaped and oriented protrusions or structures could be employed to cause the detent slider 916 to react to the movement of the lock slider 912.

In generating variations of the latching mechanism, varying the orientation of the mechanism should be considered as a method of generating a large number of embodiments. The mechanism as described in FIG. 18 is substantially in-plane, meaning that most of the movement occurs in a single plane. However, the engaging of the locking mount 928 to the grasping members 932 could be accomplished by changing the orientation of the operation of the mechanism members. For example the mechanism could be simply rotated by 90° about the lateral axis 14. Thus, the locking and unlocking of the mechanism could occur out-of-plane. The detent slider 916 might simply be a lifting ramp that raises the locking mount 928 or the grasping member 932 above the engagement plane to allow the mechanisms to retract from each other.

The mechanisms disclosed herein may be modified in many other ways to suit a wide variety of applications. The invention may be embodied in other specific forms without departing from its structures, methods, or other essential characteristics as broadly described herein and claimed hereinafter. The described embodiments are to be considered in all respects only as illustrative, and not restrictive. The scope of intellectual property rights is, therefore, indicated by the appended claims, rather than by the foregoing description. All changes that come within the meaning and range of equivalency of the claims are to be embraced within their scope.

What is claimed is:

1. A micromechanism having a first stable configuration and a second stable configuration, the micromechanism comprising:
   a base member;
   a leg having a base end and a shuttle end;
   a pin joint coupling the base member and the base end of the leg;
   a shuttle configured to slide along a substantially linear path; and
   a pin joint coupling the shuttle and the shuttle end of the leg.

2. The micromechanism of claim 1 wherein the pin joint coupling the base end of the leg to the base member is a fixed pin joint.

3. The micromechanism of claim 1 wherein the pin joint coupling the shuttle end of the leg to the shuttle is a floating pin joint.

4. The micromechanism of claim 1 wherein the base member is a microchip substrate.

5. The micromechanism of claim 1 wherein the base member is fixed to a microchip substrate.

6. The micromechanism of claim 2 wherein the leg has at least one dimple elevating the leg from the substrate.

7. The micromechanism of claim 2 wherein the floating pin joint has at least one dimple elevating the floating pin joint from the substrate.

8. The micromechanism of claim 2 wherein the shuttle has at least one dimple elevating the shuttle from the substrate.

9. The micromechanism of claim 1 wherein the leg is a compliant member.

10. The micromechanism of claim 1 wherein the leg is arched.

11. The micromechanism of claim 1 wherein the leg is substantially straight.

12. The micromechanism of claim 1 wherein the leg is generally "V" shaped.

13. The micromechanism of claim 1 wherein the leg deforms at a toggle point.

14. The micromechanism of claim 1 wherein the micromechanism is actuated by applying a rotational force at the pin joint.

15. The micromechanism of claim 1 wherein the micromechanism is actuated by applying linear force to the shuttle.

16. A micromechanism having a first stable configuration and a second stable configuration, the micromechanism comprising:
   a first base member;
   a second base member;
   a first leg having a base end and a shuttle end, wherein the base end of the first leg is coupled to the first base member by a pin joint;
   a second leg having a base end and a shuttle end, wherein the base end of the second leg is coupled to the second base member by a pin joint; and
   a shuttle having a first attachment location and a second attachment locations, wherein the shuttle end of the first leg is coupled to the first attachment location of the shuttle via a floating pin joint and the shuttle end of the second leg is attached to the second attachment location of the shuttle via a floating pint joint.

17. The micromechanism of claim 16 wherein the first and second legs are arched.

18. The micromechanism of claim 17 wherein the curvature of the arched legs has a substantial constant radius.

19. The micromechanism of claim 17 wherein the curvature of the first and the second legs at the first stable configuration is substantially the same as the curvature of the first and second legs at the second stable configuration.

20. The micromechanism of claim 16 wherein the first base member and the first leg are substantially symmetric about the shuttle to the second base member and the second leg.

21. The micromechanism of claim 16 wherein the first attachment location and second attachment location at the same position on the shuttle.

22. The micromechanism of claim 16 wherein the shuttle end of the first leg and the shuttle end of the second leg are coupled to the same floating pin joint.

23. The micromechanism of claim 16 wherein the mechanism is toggled from the first stable configuration to the second stable configuration by a thermal actuator operably connected to the shuttle.

24. The micromechanism of claim 16 wherein the mechanism is toggled from the first stable configuration to the second stable configuration by an electrostatic actuator operably connected to the shuttle.

25. The micromechanism of claim 16 wherein the shuttle has a guiding slot and a guiding mount that are configured to maintain a substantially linear travel of the shuttle.

26. The micromechanism of claim 16 wherein the shuttle has a toothed extension extending away from the center of the micromechanism, the toothed extension being engaged by at least one gear configured to rotatably drive the toothed extension in order to toggle the micromechanism between stable configurations.

27. The micromechanism of claim 25 wherein the gear has a center hub and the gear is rotated by a thermal actuator tangentially coupled to the center hub.

28. The micromechanism of claim 16 wherein the shuttle is configured to open a circuit in one stable configuration and close the circuit in the other stable configuration.

29. A micromechanism having a first stable configuration and a second stable configuration, the micromechanism comprising:
   a base member;
   a compliant leg having a base end and a shuttle end, wherein the base end of the compliant leg is integrally connected to the base member via a compliant flexible pivot; and
   a solid shuttle coupled to the shuffle end of the compliant leg via a floating pin joint, wherein the solid shuttle is configured to slide along a substantially linear path.

30. The micromechanism of claim 29 wherein the compliant flexible pivot is a small length flexural pivot.

31. A micromechanism having a first stable configuration and a second stable configuration, the micromechanism comprising:
   a base member;
   a compliant leg having a base end and a shuttle end, wherein the base end of the compliant leg coupled to the base member via a pin joint; and
   a solid shuttle integrally formed to the shuttle end of the compliant leg via a compliant flexible pivot.

32. The micromechanism of claim 31 wherein the compliant flexible pivot is a small length flexural pivot.

33. A micromechanism having a first stable configuration and a second stable configuration, the micromechanism comprising:
   a first base member;
   a second base member;
   a first set of arched legs each leg has a base end and a shuttle end, wherein the base ends of the first set of arched legs are coupled to the first base member by a plurality of pin joints;
   a second set of arched legs each leg has a base end and a shuttle end, wherein the base ends of the second set of arched legs are coupled to the second base member by a plurality of pin joints; and
   a shuttle having a first attachment side and a second attachment side, wherein the shuttle ends of the first set of arched legs are coupled to the first attachment side of the shuttle via a plurality of floating pin joints and the shuttle ends of the second set of arched legs are attached to the second attachment side of the shuttle via a plurality of floating pin joints.

* * * * *

UNITED STATES PATENT AND TRADEMARK OFFICE
CERTIFICATE OF CORRECTION

PATENT NO. : 6,982,515 B2 Page 1 of 1
APPLICATION NO. : 10/363243
DATED : January 3, 2006
INVENTOR(S) : Larry Howell et al.

It is certified that error appears in the above-identified patent and that said Letters Patent is hereby corrected as shown below:

At col. 1, line 3, please insert:

--This invention was made with government support under contract number CMS-9978737 and contract number DMI – 9624574 awarded by the National Science Foundation (NSF). The government has certain rights in the invention.--

Signed and Sealed this

Sixth Day of October, 2009

David J. Kappos
*Director of the United States Patent and Trademark Office*